(12) United States Patent
Lee et al.

(10) Patent No.: US 11,742,046 B2
(45) Date of Patent: Aug. 29, 2023

(54) SEMICONDUCTOR MEMORY DEVICE AND OPERATION METHOD OF SWIZZLING DATA

(71) Applicant: Samsung Electronics Co., Ltd., Suwon-si (KR)

(72) Inventors: Jeongho Lee, Gwacheon-si (KR); Kwangjin Lee, Bucheon-si (KR); Hee Hyun Nam, Seoul (KR); Jaeho Shin, Gwangmyeong-si (KR); Youngkwang Yoo, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/318,234

(22) Filed: May 12, 2021

(65) Prior Publication Data

US 2022/0068424 A1 Mar. 3, 2022

(30) Foreign Application Priority Data

Sep. 3, 2020 (KR) .................. 10-2020-0112063

(51) Int. Cl.
*G11C 29/42* (2006.01)
*G11C 29/44* (2006.01)
*G11C 7/10* (2006.01)
*G11C 29/18* (2006.01)

(52) U.S. Cl.
CPC ............ *G11C 29/42* (2013.01); *G11C 7/1012* (2013.01); *G11C 7/1063* (2013.01); *G11C 29/18* (2013.01); *G11C 29/44* (2013.01)

(58) Field of Classification Search
CPC ..... G11C 29/42; G11C 7/1012; G11C 7/1063; G11C 29/18; G11C 29/44
See application file for complete search history.

(56) References Cited

U.S. PATENT DOCUMENTS

| | | | |
|---|---|---|---|
| 5,269,001 A | 12/1993 | Guttag | |
| 5,960,453 A * | 9/1999 | Pawlowski | G06F 12/0879 711/E12.056 |
| 6,839,266 B1 | 1/2005 | Garrett, Jr. et al. | |
| 7,995,419 B2 * | 8/2011 | Sato | G11C 11/408 365/236 |
| 8,122,207 B2 | 2/2012 | Rajan et al. | |
| 8,509,020 B2 * | 8/2013 | Kajigaya | G11C 11/4096 365/219 |
| 8,539,322 B2 * | 9/2013 | Miyauchi | H03M 13/2707 714/788 |
| 8,595,428 B2 | 11/2013 | Bains et al. | |
| 9,053,025 B2 | 6/2015 | Ben-Kiki et al. | |
| 9,361,116 B2 | 6/2016 | Ben-Kiki et al. | |
| 9,432,298 B1 | 8/2016 | Smith | |

(Continued)

*Primary Examiner* — Vanthu T Nguyen
(74) *Attorney, Agent, or Firm* — Harness, Dickey & Pierce, P.L.C.

(57) ABSTRACT

Disclosed is a method of performing, at a controller, an access to a memory device, which includes transmitting, at the controller, a first command signal, a first address signal, and a first swizzling signal to the memory device, selecting first data bits stored in a memory cell array of the memory device based on the first command signal and the first address signal, and sequentially outputting, at the memory device, at least a part of the first data bits to the controller in a burst manner, based on the first swizzling signal.

20 Claims, 17 Drawing Sheets

(56) References Cited

U.S. PATENT DOCUMENTS

| | | | |
|---|---|---|---|
| 9,684,552 B2 | 6/2017 | Park et al. | |
| 9,812,183 B2 | 11/2017 | Intrater et al. | |
| 10,452,531 B1* | 10/2019 | Jung | G06F 12/0238 |
| 2010/0034045 A1 | 2/2010 | Sato | |
| 2011/0205824 A1* | 8/2011 | Kajigaya | G11C 7/1006 |
| | | | 365/219 |
| 2014/0189333 A1 | 7/2014 | Ben-Kiki et al. | |
| 2020/0293395 A1* | 9/2020 | Mills | G06F 3/0673 |

* cited by examiner

SEMICONDUCTOR MEMORY DEVICE AND OPERATION METHOD OF SWIZZLING DATA

CROSS-REFERENCE TO RELATED APPLICATIONS

This application claims priority under 35 U.S.C. § 119 to Korean Patent Application No. 10-2020-0112063 filed on Sep. 3, 2020, in the Korean Intellectual Property Office, the disclosures of which are incorporated by reference herein in their entireties.

BACKGROUND

Embodiments of the present disclosure described herein relate to a semiconductor memory device and a memory system, and more particularly, relate to a semiconductor memory device supporting a swizzling operation for data and an operation method thereof.

A burst mode operation of a semiconductor memory device means an operation of continuously transmitting a plurality of data bits. When a semiconductor memory device operating in a burst mode performs a read operation or a write (or program) operation, the semiconductor memory device may transmit data bits sequentially and continuously as much as a burst length. When the burst mode is applied, only an address signal corresponding to the first location where data are to be processed is transmitted without the transmission of address signals associated with the following locations. As such, the semiconductor memory device operating in the burst mode may reduce a load of a host and may perform the read operation and the write operation more quickly.

However, when the read operation is performed at the semiconductor memory device operating in the burst mode, because data are read in units of burst length, there may occur the overhead that unnecessary data are read or the read operation is repeated to obtain designated data. Also, when the write operation is performed at the semiconductor memory device operating in the burst mode, because data are written in units of burst length, there may occur the overhead that unnecessary data are written (or programmed) or the write operation is repeated to write designated data at a designated location.

SUMMARY

Embodiments of the present disclosure provide a semiconductor memory device supporting a swizzling operation for data and a memory system including the same.

According to example embodiments, a method of performing, at a controller, an access to a memory device, includes transmitting, at the controller, a first command signal, a first address signal, and a first swizzling signal to the memory device, selecting first data bits stored in a memory cell array of the memory device based on the first command signal and the first address signal, and sequentially outputting, at the memory device, at least a part of the first data bits to the controller in a burst manner, based on the first swizzling signal.

According to example embodiments, a memory device includes a memory cell array including a plurality of memory cells, and a peripheral circuit that receives a first command signal, a first address signal, and a first swizzling signal, selects first data bits stored in the plurality of memory cells based on the first command signal and the first address signal, and sequentially outputs at least a part of the first data bits, which corresponds to the first swizzling signal, from among the first data bits in a burst manner.

According to example embodiments, a memory system includes a memory including a plurality of memory cell arrays, and a controller that exchanges a data signal with the memory and to control an operation of the memory, and the memory receives a first command signal, a first address signal, and a first swizzling signal from the controller and sequentially writes first data bits included in the data signal to memory cells, which are selected based on the first swizzling signal, from among memory cells corresponding to the first address signal in a burst manner.

BRIEF DESCRIPTION OF THE FIGURES

The above and other objects and features of the present disclosure will become apparent by describing in more detail some example embodiments thereof with reference to the accompanying drawings.

DETAILED DESCRIPTION

Figure 1:
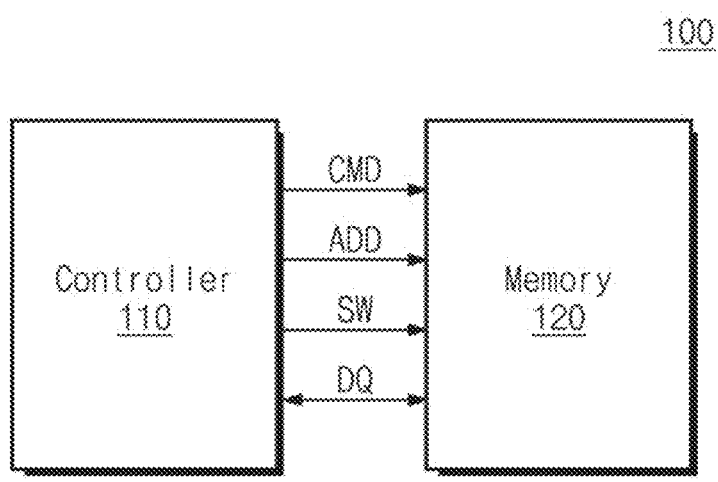
FIG. 1 is a block diagram illustrating a memory device according to example embodiments of the present disclosure.

Below, example embodiments of the present disclosure may be described in more detail and clearly to such an extent that an ordinary one in the art easily implements the present disclosure.

The terms used in the specification are provided to describe example embodiments, not to limit the present disclosure. As used in the specification, the singular terms "a," "an" and "the" are intended to include the plural forms as well, unless the context clearly indicates otherwise. The terms "comprises" and/or "comprising," when used in the specification, specify the presence of steps, operations, elements, and/or components, but do not preclude the presence or addition of one or more other steps, operations, elements, components, and/or groups thereof.

Unless otherwise defined, all terms (including technical and scientific terms) used in the specification should have the same meaning as commonly understood by those skilled in the art to which the present disclosure pertains. The terms, such as those defined in commonly used dictionaries, should not be interpreted in an idealized or overly formal sense unless expressly so defined herein. The same reference numerals represent the same elements throughout the specification.

FIG. 1 is a block diagram illustrating a memory device 100 according to example embodiments of the present disclosure. Referring to FIG. 1, the memory device 100 may include a controller 110 and a memory 120. The memory device 100 may be implemented with various dynamic random access (DRAM) devices such as a double data rate synchronous dynamic random access memory (DDR SDRAM), a DDR2 SDRAM, a DDR3 SDRAM, a DDR4 SDRAM, a DDR5 SDRAM, a low power double data rate (LPDDR) SDRAM, an LPDDR2 SDRAM, an LPDDR3 SDRAM, an LPDDR4 SDRAM, an LPDDR4X SDRAM, an LPDDR5 SDRAM, a graphics double data rate synchronous graphics random access memory (GDDR SGRAM), a GDDR2 SGRAM, a GDDR3 SGRAM, a GDDR4 SGRAM, a GDDR5 SGRAM, and a GDDR6 SGRAM. Alternatively, the memory device 100 may be implemented with a memory device, in which DRAM dies are stacked, such as a high bandwidth memory (HBM), an HBM2, or an HBM3. Alternatively, the memory device 100 may be a phase-change random access memory (PRAM) device, a static random access memory (SRAM) device, a resistive random access memory (RRAM) device, a ferroelectric random access memory (FRAM) device, a magnetic random access memory (MRAM), or the like. Alternatively, the memory device 100 may be a storage device such as a solid state drive (SSD).

The controller 110 may perform an operation for reading data stored in the memory 120 or writing data to the memory 120. The controller 110 may exchange data signals DQ with the memory 120. The data signal DQ is illustrated in FIG. 1 as one signal, but this is for reducing or preventing a drawing from being unnecessarily complicated. In example embodiments according to the present disclosure, the controller 110 and the memory 120 may exchange a plurality of data signals DQ. Also, the data signal DQ may be transmitted from the controller 110 to the memory 120 or from the memory 120 to the controller 110 in synchronization with a separate strobe signal (e.g., a data strobe signal), but the strobe signal will be omitted to reduce or prevent a drawing from being unnecessarily complicated.

To control an operation of the memory 120, the controller 110 may generate a command signal CMD, an address signal ADD, and/or a swizzling signal SW and may provide the command signal CMD, the address signal ADD, and/or the swizzling signal SW to the memory 120. The command signal CMD means a signal for requesting a specific operation of the memory 120. The command signal CMD may a read command or a write command for the memory 120. The address signal ADD means a signal indicating a location of memory cells, in which an operation requested by the controller 110 is performed, from among memory cells of the memory 120. The swizzling signal SW means a signal indicating whether to perform a swizzling operation on a specific operation requested by the memory 120. Depending on a kind of the memory device 100, the swizzling signal SW may be generated in the controller 110 or may be provided to the controller 110 from an external host device.

For example, the controller 110 may be a component included in the host. In some example embodiments, the swizzling signal SW may be generated from the external host device and may be provided to the memory 120 through the controller 110. Alternatively, the controller 110 may be a component included in a storage device such as an SSD. In some example embodiments, the controller 110 may generate the swizzling signal SW for the purpose of performing an access to the memory 120 included in the SSD and may transmit the swizzling signal SW to the memory 120. Alternatively, the controller 110 may be a component included in a memory module. In some example embodiments, the swizzling signal SW that the controller 110 generates may be provided to the memory 120, or the swizzling signal SW that the external host device generates may be provided to the memory 120 through the controller 110. A way to generate the swizzling signal SW may be variously implemented depending on a way to access the memory device 100; the above examples only correspond to some example embodiments according to the present disclosure, not limiting the present disclosure.

Although not illustrated in FIG. 1, the controller 110 may include an interface for communication with the external host device. For example, the interface may comply with a DDR SDRAM (Double Data Rate Synchronous Dynamic Random Access Memory), DIMM (Dual In-line Memory Module), RDIMM (Registered Dual In-line Memory Module), LRDIMM (Load Reduced Dual In-line Memory Module), HBM (High Bandwidth Memory), NVDIMM (Non-Volatile Dual In-line Memory Module), or PDIMM (Physical Dual In-line Memory Module) protocol.

The memory 120 may store data and may include a nonvolatile memory that retains data stored therein even though a power is turned off or a volatile memory that loses data stored therein when a power is turned off. For example, the memory 120 may include a nonvolatile memory such as a flash memory, a PRAM, an MRAM, a ReRAM, or a FRAM. Alternatively, the memory 120 may include a volatile memory such as a DRAM or an SRAM. Below, in the specification, the description will be given as a PRAM is used when the memory 120 is a nonvolatile memory and as a DRAM is used when the memory 120 is a volatile memory. However, this is only one example embodiment, and a kind of the memory 120 according to the present disclosure is not limited to the above example embodiments. Also, example embodiments are illustrated in FIG. 1 as the memory 120 is implemented with one memory chip. However, in the present disclosure, the memory 120 is not limited to the above example embodiments. For example, the memory 120 may be implemented with a memory module or a memory package including a plurality of memory chips.

The present disclosure is directed to provide a memory device capable of efficiently implementing data processing associated with the memory 120 through the swizzling operation and an operation method thereof. The swizzling operation means an operation of selectively reading data stored in the memory 120 or writing selective data to the memory 120. The swizzling operation may be implemented when the memory device 100 performs data processing in the burst mode. For example, the swizzling operation of the memory device 100 may be implemented in example embodiments of performing the read operation or the write operation in units of burst length. A configuration and a driving method for implementing the swizzling operation will be more fully described with reference to FIGS. 2 to 16B.

Figure 2:
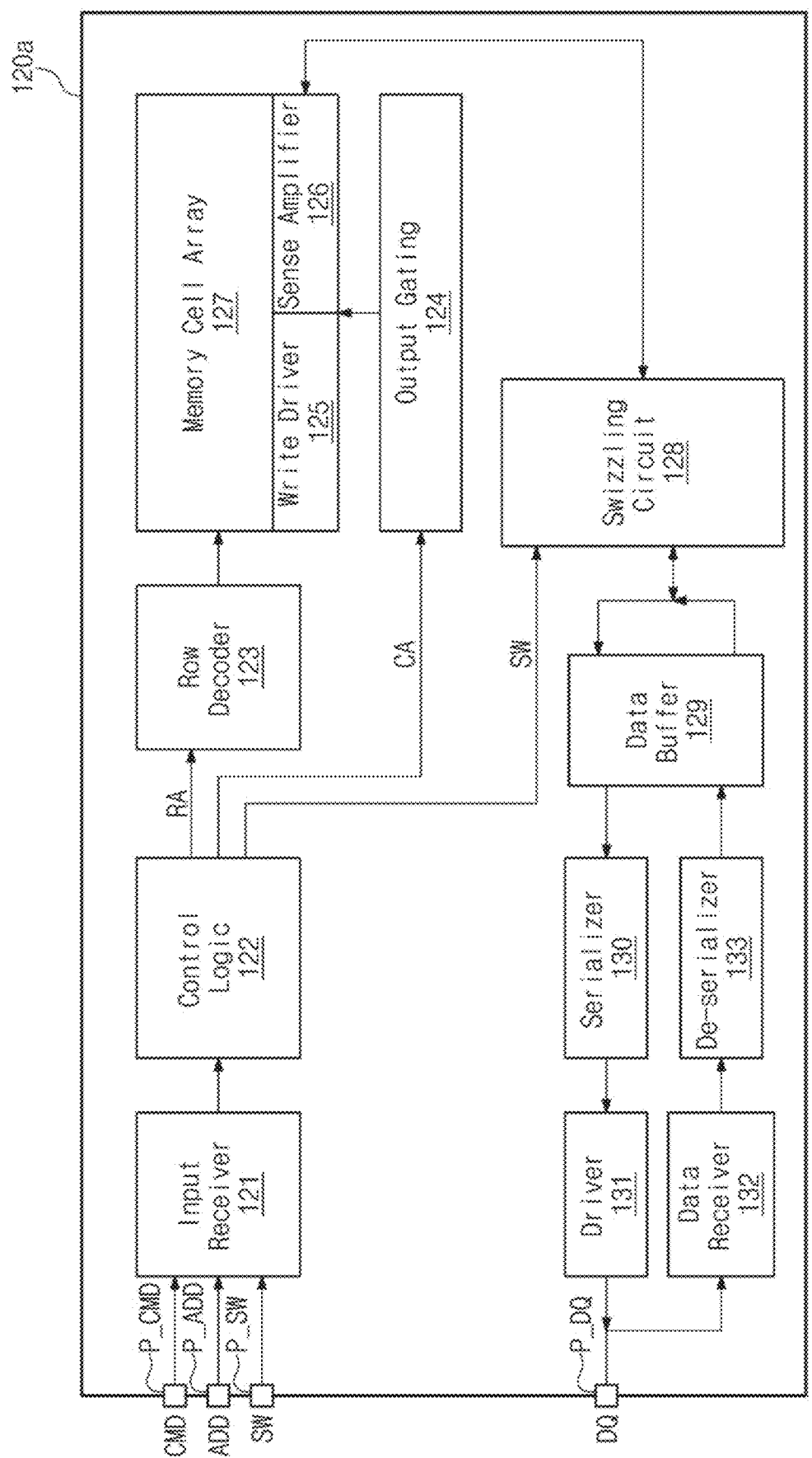
FIG. 2 is a block diagram illustrating a memory according to example embodiments of the present disclosure.

FIG. 2 is a block diagram illustrating a memory 120a according to example embodiments of the present disclosure. Referring to FIG. 2, the memory 120a may include an input receiver 121, control logic 122, a row decoder 123, an output gating circuit 124, a write driver 125, a sense amplifier 126, a memory cell array 127, a swizzling circuit 128, a data buffer 129, a serializer 130, a driver 131, a data receiver 132, and/or a de-serializer 133. The memory 120a may exchange various signals with the controller 110 (refer to FIG. 1) through a plurality of pins P_CMD, P_ADD, P_SW, and P_DQ. Excepting the memory cell array 127, the remaining components disclosed in FIG. 2 may be collectively referred to as a "peripheral circuit".

The memory 120a may receive the command signal CMD for reading data stored in the memory 120a or writing (or programming) data to the memory 120a. The command signal CMD may include a read command or a write command. The memory 120a may receive the command signal CMD from the controller 110 through the command pin P_CMD. The command signal CMD may be a unidirectional signal that is only transferred from the controller 110 to the memory 120a, and the command pin P_CMD may be an input terminal.

Also, the memory 120a may receive the address signal ADD for designating a location targeted for data processing (e.g., a read/write operation) from among locations in the memory cell array 127. The address signal ADD may include a row address RA or a column address CA. The memory 120a may receive the address signal ADD from an external host device through the address pin P_ADD. The address signal ADD may be a unidirectional signal that is only transferred from the external host device to the memory 120a, and the address pin P_ADD may be an input terminal.

Also, the memory 120a may receive the swizzling signal SW for performing the swizzling operation. The swizzling signal SW may include a swizzling read signal or a swizzling write signal. The memory 120a may receive the swizzling signal SW from the controller 110 through the swizzling pin P_SW. The swizzling signal SW may be a unidirectional signal that is only transferred from the controller 110 to the memory 120a, and the swizzling pin P_SW may be an input terminal. Also, the swizzling pin P_SW may be determined in advance in compliance with various protocols associated with the memory 120a or may be implemented with at least one of pins that are classified as reserved future use (RFU) pins in compliance with the DDR SDRAM, DIMM, LRDIMM, HBM, NVDIMM, or PDIMM form factor.

The memory 120a may exchange the data signal DQ, which includes data bits to be processed based on the command signal CMD, with the controller 110. The data signal DQ may include read data bits output from the memory cell array 127 based on a read command or may include write data bits to be written to the memory cell array 127 based on a write command. The data signal DQ may be exchanged between the controller 110 and the memory 120a through the DQ pin P_DQ in synchronization with a data strobe signal (not illustrated). The data signal DQ may be a bidirectional signal, which is input from the controller 110 to the memory 120a or is output from the memory 120a to the controller 110, that is, a data input/output signal, and the DQ pin P_DQ may be an input/output terminal.

For convenience of description, example embodiments are illustrated in FIG. 2 as the memory 120a includes one command pin P_CMD, one address pin P_ADD, one swizzling pin P_SW, and one DQ pin P_DQ. However, the memory 120a according to example embodiments of the present disclosure may include a plurality of command pins P_CMD, a plurality of address pins P_ADD, a plurality of swizzling pins P_SW, and a plurality of DQ pins P_DQ. Also, for convenience of description, example embodiments are illustrated in FIG. 1 as one command signal CMD, one address signal ADD, one swizzling signal SW, and one data signal DQ are used to drive the memory device 100 (refer to FIG. 1). However, a plurality of command signals CMD, a plurality of address signals ADD, a plurality of swizzling signals SW, or a plurality of data signals DQ may be used to drive the memory device 100 according to the present disclosure.

Also, the command signal CMD, the address signal ADD, the swizzling signal SW, and the data signal DQ are only illustrated in FIG. 2. This is for reducing or preventing a drawing from being unnecessarily complicated, and signals that the memory device 100 according to example embodiments of the present disclosure uses are not limited to those illustrated in FIG. 2. For example, although not illustrated in FIG. 2, a clock signal, a row address strobe (RAS) signal, a column address strobe (CAS) signal, a data strobe signal, a chip enable signal (CS), a read enable signal (RE), a write enable signal (WE), and/or the like may be used to drive the memory device 100 according to example embodiments of the present disclosure.

In the memory 120a according to example embodiments of the present disclosure, the command signal CMD, the address signal ADD, and the swizzling signal SW may be input to the input receiver 121. The input receiver 121 may sample the command signal CMD, the address signal ADD, and the swizzling signal SW at rising edges or falling edges of an internal clock signal, respectively. The input receiver 121 may provide the command signal CMD, the address signal ADD, and the swizzling signal SW thus sampled to the control logic 122.

Also, although not illustrated in FIG. 2, the input receiver 121 may receive a plurality of control signals for controlling the memory 120a from the controller 110 and may provide the received signals to the control logic 122. The plurality of control signals may include the clock signal, the row address strobe signal, the column address strobe signal, the data strobe signal, the chip enable signal, the read enable signal, the write enable signal, and/or the like.

Although not illustrated in FIG. 2, the control logic 122 may include a mode register and a command decoder. The mode register may store data for controlling various operation modes of the memory device 100. For example, data stored in the mode register may include data associated with burst mode setting, burst type setting, burst length setting, column address strobe (CAS) latency setting, delay locked loop (DLL) enable or reset setting, temperature sensor setting, write recovery (WR) and read to precharge (RTP) setting, and/or the like. The command decoder may decode the plurality of control signals from the input receiver 121 and may generate internal control signals for controlling any other components of the memory 120*a* depending on a decoding result. The internal control signals thus generated may be provided to any other components of the memory 120*a*.

The control logic 122 may control components in the memory 120 based on the internal control signals. For example, based on a read command signal, the control logic 122 may allow the memory 120*a* to perform the read operation; based on a write command signal, the control logic 122 may allow the memory 120*a* to perform the write operation.

Also, based on the address signal ADD, the control logic 122 may designate (or select) a location in the memory cell array 127, at which an operation is to be performed. The address signal ADD may include a row address signal RA and a column address signal CA. The control logic 122 may output the row address RA to the row decoder 123 and may output the column address signal CA to the output gating circuit 124. Also, the control logic 122 may transfer a decided swizzling signal SW to the swizzling circuit 128.

The row decoder 123 may receive the row address signal RA and a control signal for controlling the row decoder 123, from the control logic 122. The row decoder 123 may decode the row address signal RA in response to the control signal from the control logic 122 and may select one of a plurality of word lines (not illustrated) in the memory cell array 127 depending on a decoding result.

The output gating circuit 124 may receive the column address signal CA from the control logic 122. The output gating circuit 124 may decode the column address signal CA from the control logic 122 and may generate column selection signals associated with a plurality of columns in the memory cell array 127 depending on a decoding result. The output gating circuit 124 may connect the swizzling circuit 128 with the write driver 125 or the sense amplifier 126 based on the column selection signals thus generated.

In the write operation, the write driver 125 may receive data input based on the column selection signals and may write the received data to the memory cell array 127. The sense amplifier 126 may sense and amplify voltage changes of bit lines. The sense amplifier 126 may output bits of columns selected by a column selection signal. As such, when the memory device 100 performs the read operation, the memory device 100 may output data stored in a cell, which is connected with a bit line whose voltage change is sensed and amplified by the sense amplifier 126, from among cells in the memory cell array 127 depending on the column selection signals. Alternatively, when the memory device 100 performs the write operation, the memory device 100 may transfer input data to the write driver 125 based on the column selection signals, and the write driver 125 may write the input data to a cell, the location of which is designated by the column selection signals, from among the cells of the memory cell array 127.

The memory cell array 127 may include memory cells that are repeatedly arranged. The memory cell array 127 may include at least one bank. The number of banks may be in advance determined in compliance with various protocols of the memory device 100. The memory cells may be disposed at intersections of word lines and bit lines of the bank. For example, the memory cells may include at least one of a DRAM cell, a PRAM cell, an SRAM cell, a RRAM cell, or an MRAM cell.

The swizzling circuit 128 supports selective data processing when the memory device 100 according to example embodiments of the present disclosure performs the read operation and the write operation. In other words, in the read operation, the memory device 100 may select read data such that only extracted data are output; in the write operation, the memory device 100 may write (or program) data at locations selected in advance. A configuration and an operation principle of the swizzling circuit 128 will be more fully described with reference to FIGS. 6 to 14.

The data buffer 129 may perform buffering in the read operation or the write operation. For example, when the read operation of the memory device 100 is performed, the data buffer 129 may receive data that are read from the memory cell array 127 and are selected by the swizzling circuit 128. The data buffer 129 may output the received data to the serializer 130. Alternatively, when the write operation of the memory device 100 is performed, the data buffer 129 may receive data from the de-serializer 133. The data buffer 129 may output the received data to the swizzling circuit 128.

The data buffer 129 is illustrated in FIG. 2 as performing a function of exchanging data when the write operation and the read operation are performed, but this is only one example embodiment. For example, the memory device 100 according to the present disclosure is not limited to the example illustrated in FIG. 2. In other words, the memory device 100 according to the present disclosure may have various structures. For example, the data buffer 129 may be configured to include a read data buffer (not illustrated) used in the read operation and a write data buffer (not illustrated) used in the write operation, which are implemented independently of each other.

When the memory device 100 according to example embodiments of the present disclosure performs the read operation, the serializer 130 may read and serialize bits of read data from the data buffer 129. The serializer 130 may provide the serialized data bits to the driver 131, and the driver 131 may output data to the controller 110.

When the memory device 100 according to example embodiments of the present disclosure performs the write operation, the data receiver 132 may receive data bits to be written from the controller 110. The data receiver 132 may provide the received data to the de-serializer 133. The de-serializer 133 may receive and de-serialize data bits received from the data receiver 132. The de-serializer 133 may provide the de-serialized data bits to the data buffer 129.

When the read operation is performed at the memory 120*a* according to example embodiments of the present disclosure, the input receiver 121 may receive the command signal CMD for the read operation, the address signal ADD indicating a location in the memory cell array 127, at which the read operation is to be performed, and the swizzling pin P_SW indicating whether to perform the swizzling operation in the read operation, from the controller 110. The input receiver 121 may provide the received signals CMD, ADD, and SW to the control logic 122, and the control logic 122 may provide the row address signal RA and the column address signal CA to the row decoder 123 and the output gating circuit 124, respectively.

The memory device 100 may read data stored at the location in the memory cell array 127, which the row address signal RA and the column address signal CA indicate. The memory device 100 according to example embodiments of the present disclosure may operate in the burst mode. The memory device 100 may specify only a location of the first data bit (or the first memory cell) targeted form the read operation and may read data bits as much as a burst length. The data bits read from the memory cell array 127 may be input to the swizzling circuit 128. In example embodiments where the swizzling signal SW is enabled, the swizzling circuit 128 may perform a swizzling read operation on read data bits and may then provide selected data bits to the serializer 130 through the data buffer 129. The data bits provided to the serializer 130 may be output to the controller 110 through the driver 131 after a serialization process.

When the write operation is performed at the memory 120a according to example embodiments of the present disclosure, the input receiver 121 may receive the command signal CMD for the write operation, the address signal ADD indicating a location in the memory cell array 127, at which the write operation is to be performed, and the swizzling pin P_SW indicating whether to perform the swizzling operation in the write operation, from the controller 110. The input receiver 121 may provide the received signals CMD, ADD, and SW to the control logic 122, and the control logic 122 may provide the row address signal RA and the column address signal CA to the row decoder 123 and the output gating circuit 124, respectively.

The memory device 100 may write data at the location in the memory cell array 127, which the row address signal RA and the column address signal CA indicate. The memory device 100 according to example embodiments of the present disclosure may operate in the burst mode in which data bits corresponding to a burst length are written (or programmed). In particular, when the swizzling signal SW is enabled, the memory device 100 may select a location of a memory cell for storing a data bit by using the swizzling circuit 128. Data bits input to the memory 120a may be transferred to the de-serializer 133 through the data receiver 132, and data bits de-serialized by the de-serializer 133 may be provided to the swizzling circuit 128 through the data buffer 129. The swizzling circuit 128 may perform the swizzling write operation on the de-serialized data bits, and the memory device 100 may store the data bits at a selected location in the memory cell array 127.

Each of components constituting the memory 120a according to example embodiments of the present disclosure is illustrated as one entity, but this is only one example embodiment according to the present disclosure, not limiting the present disclosure. In other words, the memory 120a according to example embodiments of the present disclosure may be understood as including at least one for each of the above components.

Figure 3:
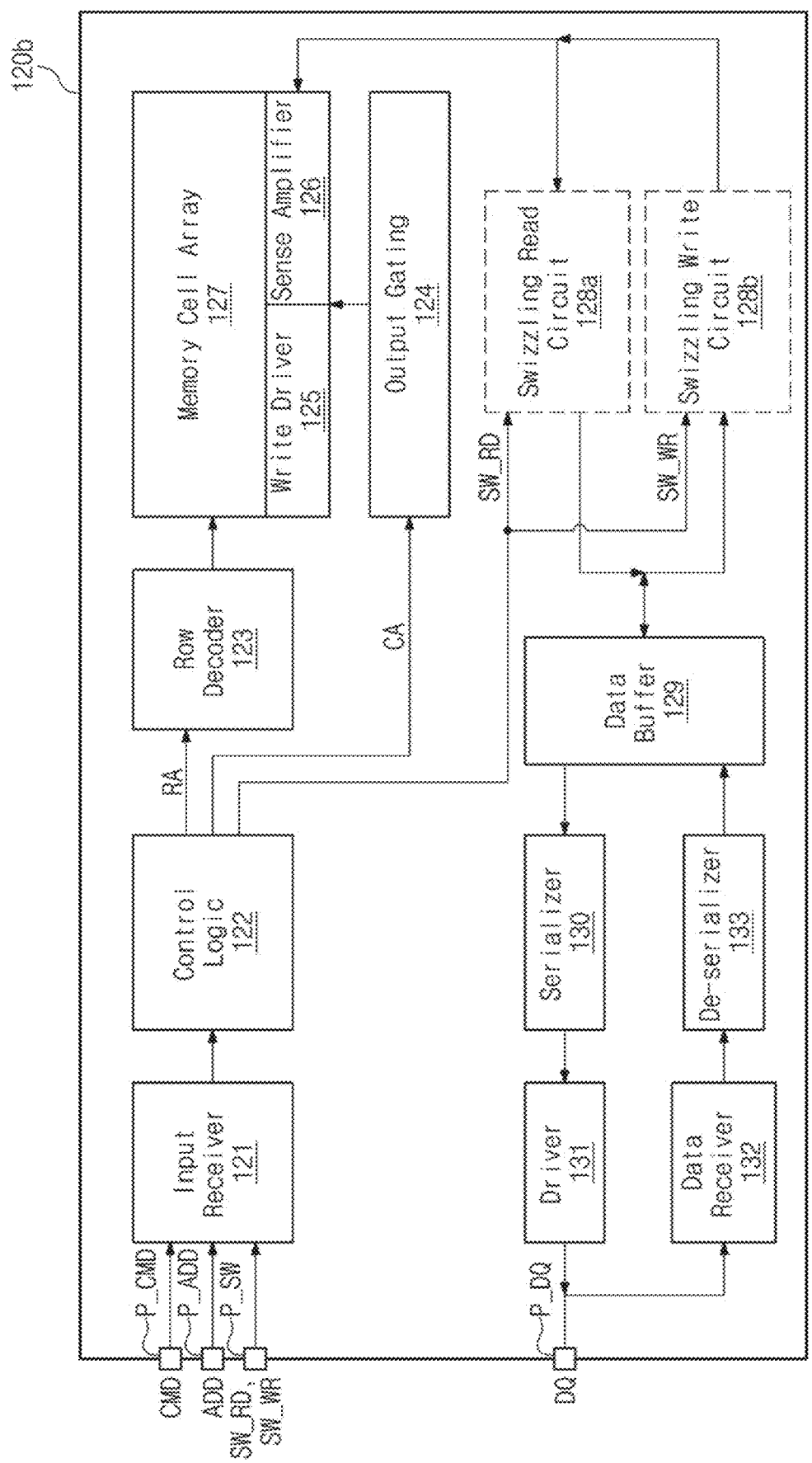
FIG. 3 is a block diagram illustrating a memory according to other example embodiments of the present disclosure.

FIG. 3 is a block diagram illustrating a memory device 120b according to other example embodiments of the present disclosure. Below, in the memory 120b disclosed in FIG. 3, additional description associated with the components, functions, characteristics, and operations described with reference to FIGS. 1 and 2 will be omitted to avoid redundancy. Referring to FIG. 3, like the memory 120a disclosed in FIG. 2, the memory 120b according to other example embodiments of the present disclosure may include the input receiver 121, the control logic 122, the row decoder 123, the output gating circuit 124, the write driver 125, the sense amplifier 126, the memory cell array 127, the data buffer 129, the serializer 130, the driver 131, the data receiver 132, and/or the de-serializer 133. Excepting the memory cell array 127, the remaining components of the components disclosed in FIG. 3 may be collectively referred to as a "peripheral circuit".

The memory 120b according to example embodiments disclosed in FIG. 3 may include a swizzling read circuit 128a and a swizzling write circuit 128b separated from each other instead of the swizzling circuit 128 (refer to FIG. 2) or may include one of the swizzling read circuit 128a and the swizzling write circuit 128b instead of the swizzling circuit 128. When the memory device 100 (refer to FIG. 1) according to the present disclosure performs the read operation, the swizzling read circuit 128a may perform the swizzling operation on read data. When the memory device 100 according to the present disclosure performs the write operation, the swizzling write circuit 128b may perform the swizzling operation on a storage location of data to be written (or programmed). When the swizzling signal SW is enabled in the read operation, a swizzling read signal SW_RD may be provided to the swizzling read circuit 128a; when the swizzling signal SW is enabled in the write operation, a swizzling write signal SW_WR may be provided to the swizzling write circuit 128b.

Figure 4A:
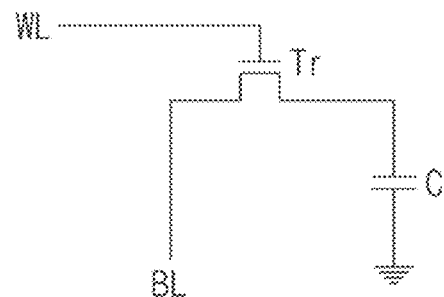
FIGS. 4A and 4B are circuit diagrams of a memory cell of a memory cell array according to other example embodiments of the present disclosure.
Figure 4B:
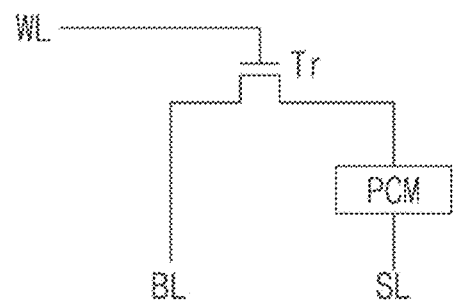

FIGS. 4A and 4B are circuit diagrams of a memory cell constituting the memory cell array 127 (refer to FIGS. 2 and 3) according to example embodiments of the present disclosure. For example, FIG. 4A is a circuit diagram of a DRAM cell 127a included in the memory cell array 127, and FIG. 4B is a circuit diagram of a PRAM cell 127b included in the memory cell array 127.

Referring to FIG. 4A, the DRAM cell 127a may include a transistor Tr and a capacitor "C". A gate of the transistor Tr may be connected with a word line WL. A first terminal of the transistor Tr may be connected with a bit line BL, and a second terminal thereof may be connected with the capacitor "C".

To read data stored in the DRAM cell 127a, a high voltage $V_H$ may be applied to the word line WL, and a bit line voltage may be applied to the bit line BL. The bit line voltage may be a voltage of $V_{DD}/2$ corresponding to half the source voltage VDD. In example embodiments where data "1" are stored in the DRAM cell 127a, a voltage of the bit line BL may increase due to charges present in the capacitor "C". As the voltage of the bit line BL increases, data "1" may be read. In contrast, in example embodiments where data "0" are stored in the DRAM cell 127a, because charges are absent from the capacitor "C", a voltage of the bit line BL may decrease. As the voltage of the bit line BL decreases, data "0" may be read.

To write data to the DRAM cell 127a, the high voltage VH that is higher in level than the source voltage VDD may be applied to the word line WL. When the high voltage VH is simultaneously applied to the bit line BL with the high voltage VH applied to the word line WL, charges may be stored in the capacitor "C". As charges are stored in the capacitor "C", data "1" are written to the DRAM cell 127a. When a ground voltage is simultaneously applied to the bit line BL with the high voltage VH applied to the word line WL, charges present in the capacitor "C" may be discharged to the bit line BL. As the capacitor "C" is discharged, data "0" are written to the DRAM cell 127a.

Referring to FIG. 4B, the PRAM cell 127b may include a transistor Tr and a phase change material PCM. A gate of the transistor Tr may be connected with a word line WL. A first terminal of the transistor Tr may be connected with a bit line BL, and a second terminal thereof may be connected with the phase change material PCM. One end of the phase change material PCM may be connected with a source line (not illustrated). In example embodiments, the phase change material PCM may include a chalcogenide compound such as germanium-antimony-tellurium (GST). A phase of the phase change material PCM may change depending on the amount of heat energy that is based on an electrical pulse applied to the phase change material PCM.

In a read operation, a data value of the PRAM cell 127b may be determined based on a resistance value of the phase change material PCM. When the read operation is performed on the PRAM cell 127b, a turn-on voltage may be applied to the word line WL, and a read voltage may be applied to the bit line BL. The read voltage that is applied to the bit line BL is limited to a voltage within a range where a state of the phase change material PCM does not change. When the amount of current flowing through the phase change material PCM is a threshold value or greater, that is, when the phase change material PCM is in a low-resistance state, data "1" may be read. Also, when the amount of current flowing through the phase change material PCM is smaller than the threshold value, that is, when the phase change material PCM is in a high-resistance state, data "0" may be read. In example embodiments of reading data stored in the PRAM cell 127b, the threshold value that is used to determine a value of the data may vary depending on a kind of the phase change material PCM.

In a write operation, a data value may be differently written to the PRAM cell 127b, based on a crystalline state of the phase change material PCM determined depending on the amount of heat energy applied to the phase change material PCM. When an electrical pulse is applied to the PRAM cell 127b, a phase of the phase change material PCM may change, and thus, data may be written to the PRAM cell 127b (e.g., the write operation may be performed on the PRAM cell 127b). When the phase change material PCM is in an amorphous state, the phase change material PCM may have a relatively great resistance value of tens KΩ to several MΩ, and thus, data "0" may be written to the PRAM cell 127b. When the phase change material PCM is in a crystalline state, the phase change material PCM may have a relatively small resistance value of several KΩ, and thus, data "1" may be written to the PRAM cell 127b. How a phase of the phase change material PCM of the PRAM cell 127b changes will be more fully described with reference to FIG. 5.

Figure 5:
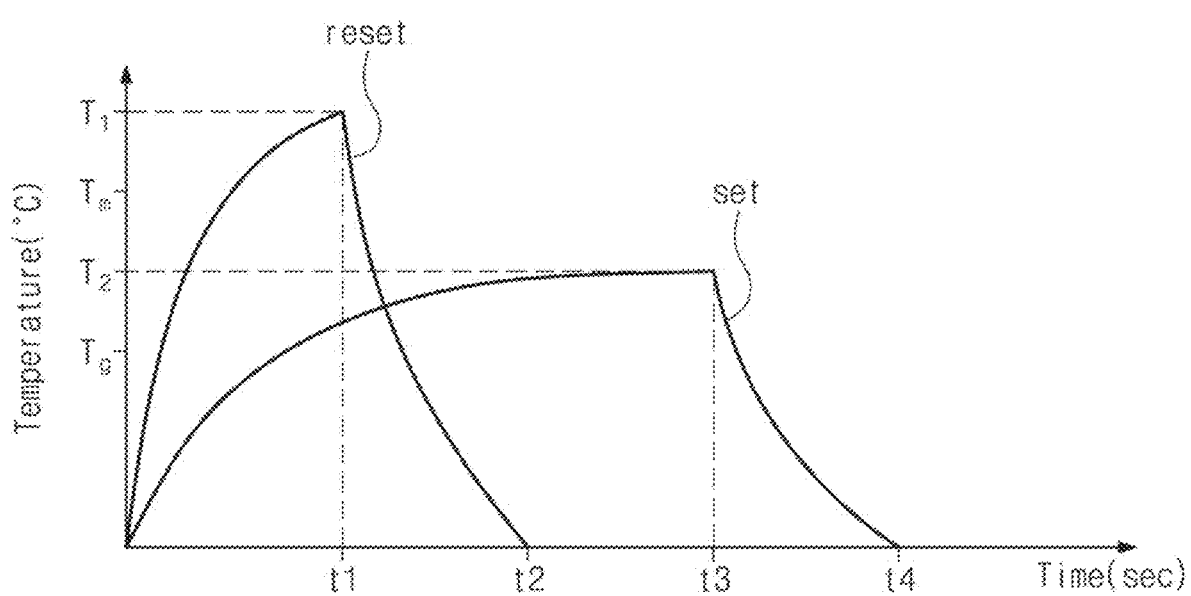
FIG. 5 is a diagram for describing a characteristic of a PRAM cell disclosed in FIG. 4B.

FIG. 5 is a diagram for describing a characteristic of the PRAM cell 127b (refer to FIG. 4B) disclosed in FIG. 4B. A reversible phase change of the phase change material PCM (refer to FIG. 4B) included in the PRAM cell 127b may be made by the Joule heating that is generated by an electrical pulse applied from the outside. In the PRAM cell 127b, the process of controlling a phase of the phase change material PCM by using the Joule heating may be referred to as a "set/reset process", which is adjusted by a level of an electrical pulse and a time during which the electrical pulse is applied to the PRAM cell 127b. In the write operation, data "0" may be written to the PRAM cell 127b through the reset process, and data "1" may be written to the PRAM cell 127b through the set process. However, data values written through the set and reset processes are not limited thereto.

The reset process means the process of changing a phase of the phase change material PCM to an amorphous state by heating the phase change material PCM at a melting temperature Tm or higher and then cooling the phase change material PCM. Referring to FIG. 5, to implement the reset process, the phase change material PCM may be heated by using heat energy generated by an electrical pulse so as to have a first temperature $T_1$ higher than the melting temperature Tm in a time period 0 to t1. After a temperature of the phase change material PCM reaches the first temperature $T_1$, the phase change material PCM may be rapidly cooled during a second time period t1 to t2. A phase of the rapidly cooled phase change material PCM may be changed to an amorphous state. In some example embodiments, data "0" may be written to the PRAM cell 127b.

The set process means the process of changing a phase of the phase change material PCM to a crystalline state by sufficiently heating the phase change material PCM at a glass transition temperature $T_g$ or higher and cooling the phase change material PCM at a low speed. Referring to FIG. 5, to implement the set process, the phase change material PCM may be slowly heated by using the heat energy due to an electrical pulse so as to have a second temperature $T_2$, which is higher than the glass transition temperature $T_g$ and is lower than the melting temperature Tm, in a third time period 0 to t3. After the temperature of the phase change material PCM reaches the second temperature T2, the phase change material PCM may be slowly cooled in a fourth time period t3 to t4. A phase of the slowly cooled phase change material PCM may be changed to a crystalline state. In some example embodiments, data "1" may be written to the PRAM cell 127b.

Figure 6:
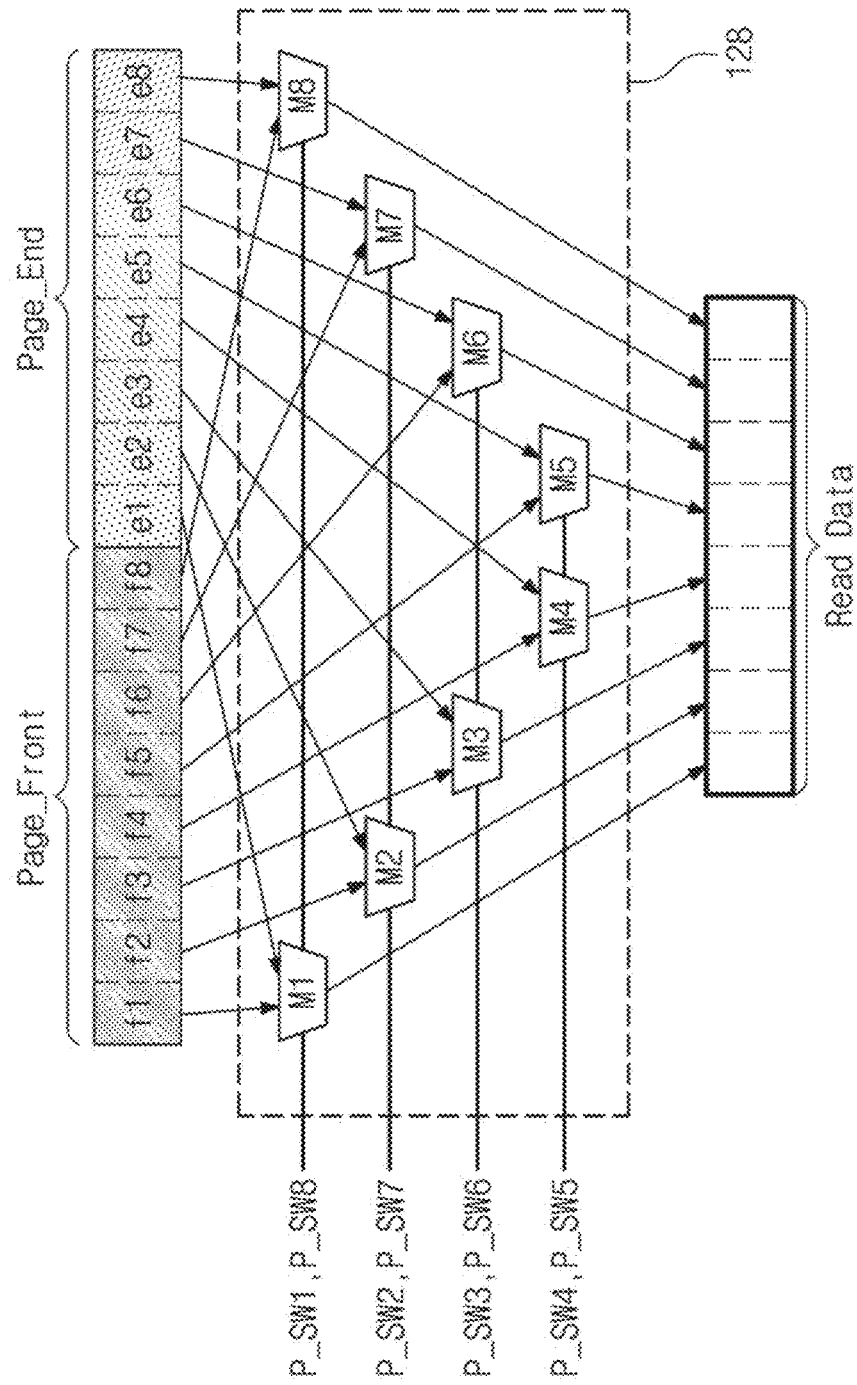
FIG. 6 is a diagram for describing a swizzling read operation according to example embodiments of the present disclosure.

FIG. 6 is a diagram for describing a swizzling read operation according to example embodiments of the present disclosure. The description will be given with reference to FIG. 6 under the assumption that a burst length of the memory device 100 (refer to FIG. 1) corresponds to 8 data bits and one page includes first to sixteenth data bits f1 to f8 and e1 to e8. A page means a plurality of data bits stored in memory cells connected with one word line. For convenience of description, one page disclosed in FIG. 6 is expressed as composed of a front page Page_Front and an end page Page_End, the front page Page_Front is expressed as including the first to eighth data bits f1 to f8, the number of which corresponds to the burst length, and the end page Page_End is expressed as including the ninth to sixteenth data bits e1 to e8, the number of which corresponds to the burst length. However, the example embodiments disclosed in FIG. 6 are only example embodiments of the present disclosure, not limiting the present disclosure.

For example, in example embodiments where the swizzling circuit 128 is not included, the memory device 100 operating in the burst mode may receive only an address of the first memory cell targeted for the read operation and may then read data bits as much as a burst length. In other words, the memory device 100 may receive only an address of the first data bit f1 included in the front page Page_Front and may then read data bits continuously from the first data bit f1 as much as a burst length. Accordingly, in example embodiments where a burst length is 8, in response to an input of the address of the first data bit f1, the memory device 100 may read the first data bit f1 to the eighth data bit f8 through one read operation. Also, in example embodiments where a burst length is 8, in response to an input of an address of the ninth data bit e1, the memory device 100 may read the ninth data bit e1 to the sixteenth data bit e8 through one read operation.

According to the above description, to read the first to fourth data bits f1 to f4 and the thirteenth to sixteenth data bits e5 to e8 from the memory device 100 operating in the burst mode, the memory device 100 may accompany at least two read operations. That is, after the memory device 100 reads the first to eighth data bits f1 to f8 included in the front page Page_Front through a first read operation and reads the ninth to sixteenth data bits e1 to e8 included in the end page Page_End through a second read operation, the controller 110 (refer to FIG. 1) may merge the first to eighth data bits f1 to f8 and the ninth to sixteenth data bits e1 to e8 and may output the first to fourth data bits f1 to f4 and the thirteenth to sixteenth data bits e5 to e8 as read-requested data. As such, the overhead that the memory device 100 performs two read operations may occur. That is, the memory device 100 may also read unnecessary data bits through the first read operation and the second read operation, such as the fifth to eighth data bits f5 to f8 and the ninth to twelfth data bits e1 to e4.

However, the memory device 100 according to the present disclosure, which includes the swizzling circuit 128, may reduce or prevent the above overhead in the read operation. The swizzling circuit 128 may include multiplexers MUX, the number of which corresponds to a burst length. For example, the memory device 100 may include 8 multiplexers M1 to M8. Each of the multiplexers M1 to M8 may select one of data bits and may output the selected data bit as a read-requested data bit. Data bits that are respectively selected by the multiplexers M1 to M8 may be determined by the swizzling signal SW (refer to FIG. 2) that is applied to each of first to eighth swizzling pins P_SW1 to P_SW8. The swizzling signal SW may be provided from the controller 110 (refer to FIG. 1). The first to eighth swizzling pins P_SW1 to P_SW8 may be included in the swizzling pin P_SW and may be implemented with pins classified as RFU pins in the memory 120 (refer to FIG. 1).

For example, in example embodiments where the swizzling signal SW of a first logical level (e.g., low) is applied, the memory device 100 according to example embodiments of the present disclosure may read data bits included in the front page Page_Front; in example embodiments where the swizzling signal SW of a second logical level (e.g., high) is applied, the memory device 100 according to example embodiments of the present disclosure may read data bits included in the end page Page_End. Accordingly, in example embodiments where a signal of the first logical level is applied to the first swizzling pin P_SW1, the memory device 100 may read the first data bit f1 included in the front page Page_Front from among the first data bit f1 included in the front page Page_Front and the ninth data bit e1 included in the end page Page_End. In example embodiments where a signal of the second logical level is applied to the second swizzling pin P_SW2, the memory device 100 may read the tenth data bit e2 included in the end page Page_End from among the second data bit f2 included in the front page Page_Front and the tenth data bit e2 included in the end page Page_End. A result of performing, by the swizzling circuit 128 of the present disclosure, the swizzling operation will be more fully described with reference to FIG. 7.

Figure 7:
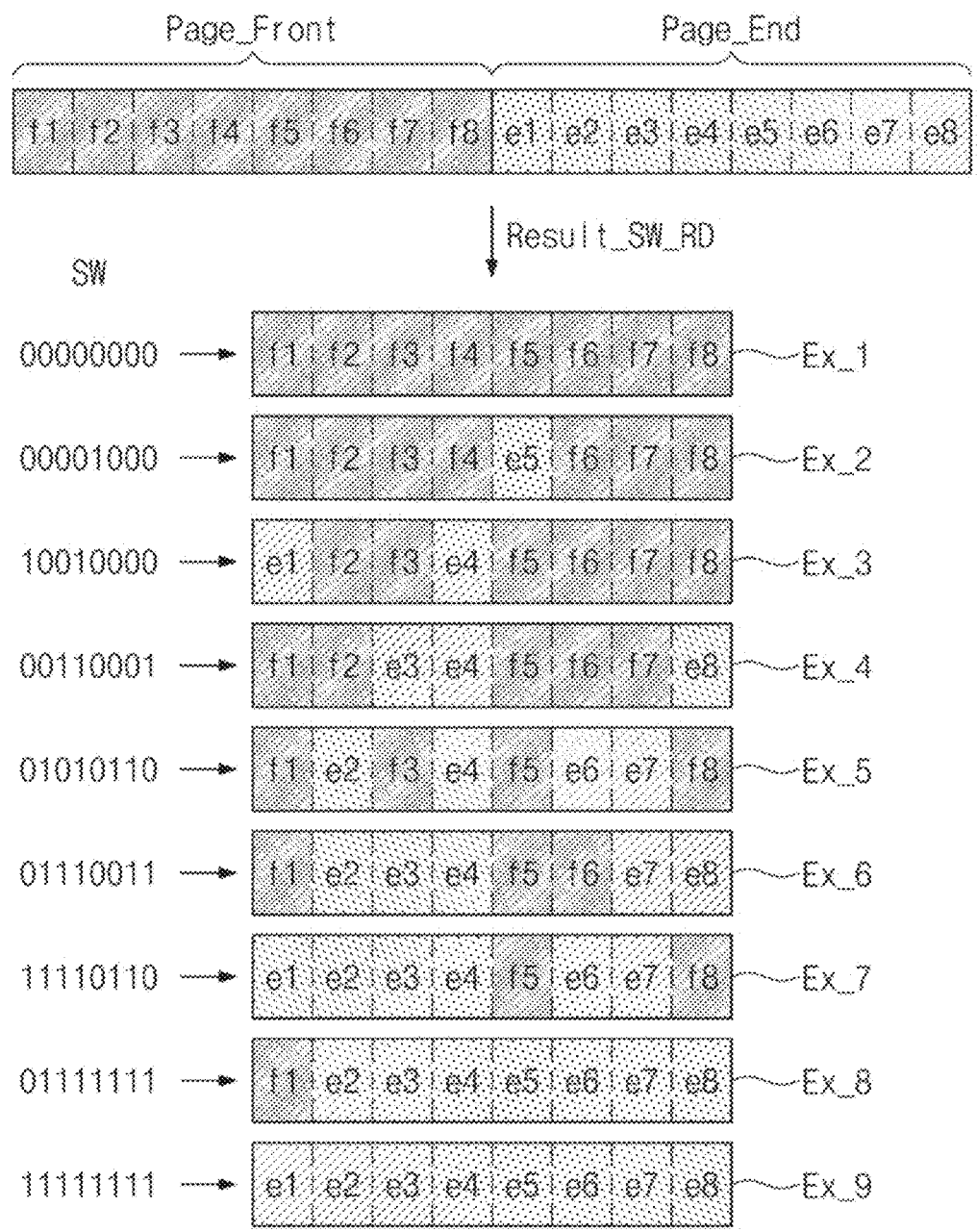
FIG. 7 is a diagram illustrating an example of results of swizzling read operations according to example embodiments of the present disclosure.

FIG. 7 is a diagram illustrating an example of results Result_SW_RD of swizzling read operations according to example embodiments of the present disclosure. The results Result_SW_RD of the swizzling read operations of FIG. 7 may be obtained under the assumption that the memory device 100 (refer to FIG. 1) according to example embodiments of the present disclosure is designed to read a data bit included in the front page Page_Front when the swizzling signal SW (refer to FIG. 2) of logic "0" is applied and to read a data bit included in the end page Page_End when the swizzling signal SW of logic "1" is applied. The results Result_SW_RD of the swizzling read operations disclosed in FIG. 7 relate to only some example embodiments according to the present disclosure, and the memory device 100 (refer to FIG. 1) according to the present disclosure may draw various results depending on how to design the memory device 100.

As a result of reading the first to eighth data bits f1 to f8 included in the front page Page_Front, a first result Ex_1 disclosed in FIG. 7 indicates a result that is obtained when "00000000" are respectively applied to the first to eighth swizzling pins P_SW1 to P_SW8 (refer to FIG. 6). A second result Ex_2 disclosed in FIG. 7 indicates a result that is obtained when "00001000" are applied, a third result Ex_3 indicates a result that is obtained when "10010000" are applied, a fourth result Ex_4 indicates a result that is obtained when "00110001" are applied, and a fifth result Ex_5 indicates a result that is obtained when "01010110" are applied. A sixth result Ex_6 indicates a result that is obtained when "01110011" are applied, a seventh result Ex_7 indicates a result that is obtained when "11110110" are applied, an eighth result Ex_8 indicates a result that is obtained when "01111111" are applied, and a ninth result Ex_9 indicates a result that is obtained when "11111111" are applied.

Figure 8:
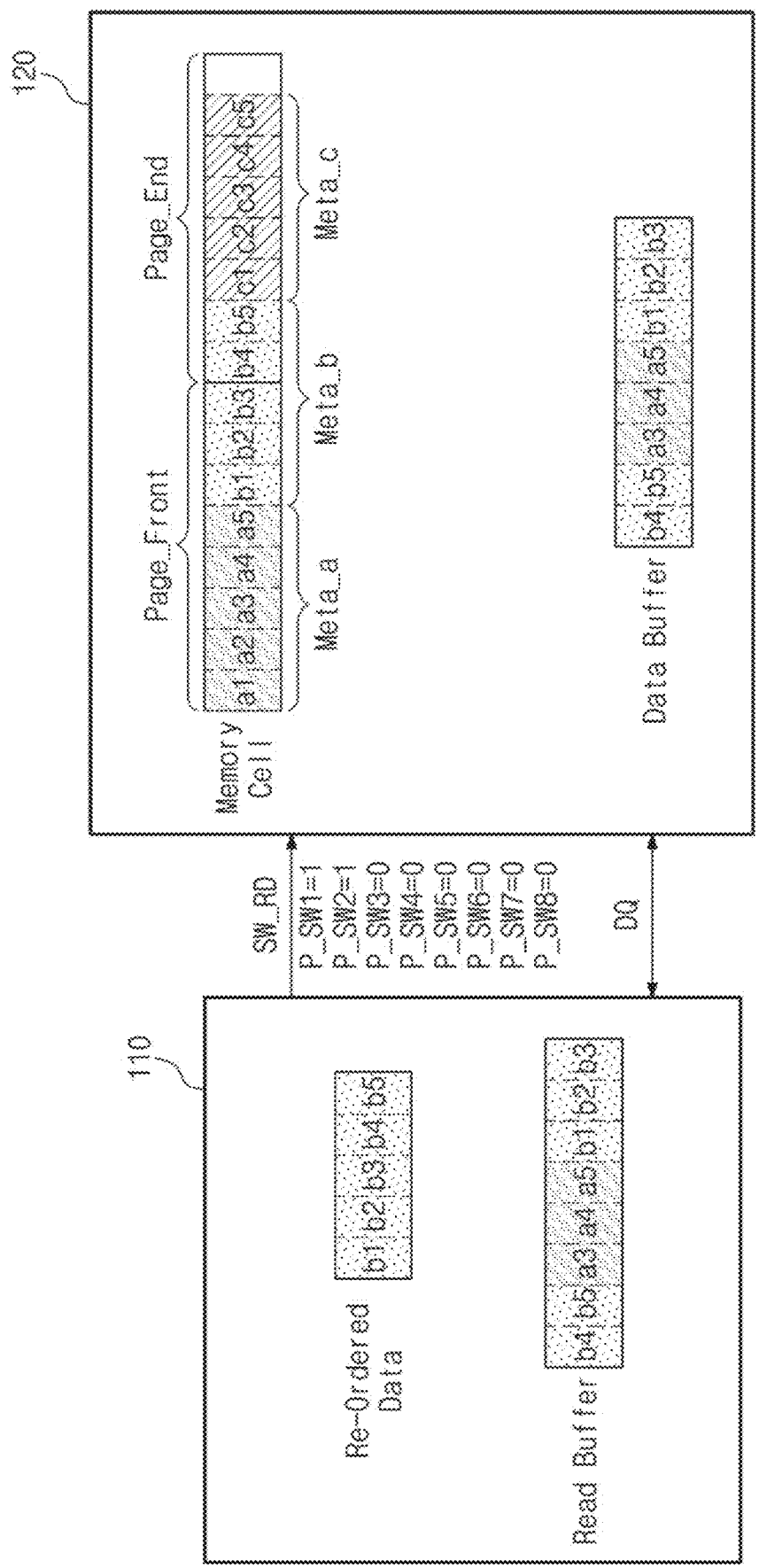
FIG. 8 is a diagram illustrating a process of extracting meta data by using a swizzling read operation according to example embodiments of the present disclosure.

FIG. 8 is a diagram illustrating a process of extracting data by using a swizzling read operation according to example embodiments of the present disclosure. For example, FIG. 8 shows a process of extracting second meta data Meta_b illustrated in FIG. 8 by using the swizzling read operation. The swizzling read operation disclosed in FIG. 8 will be described under the assumption that a burst length corresponds to 8 data bits and one page includes 16 data bits. The description will be given under the assumption that the memory device 100 according to example embodiments of the present disclosure is designed to read a data bit included in the front page Page_Front when a swizzling read signal SW_RD of logic "0" is applied and to read a data bit included in the end page Page_End when the swizzling read signal SW_RD of logic "1" is applied.

Memory cells included in the memory 120 of FIG. 8 may constitute one page, and one page may be divided into the front page Page_Front and the end page Page_End. Each of the front page Page_Front and the end page Page_End may include 8 data bits, and each of the first meta data Meta_a, second meta data Meta_b, and third meta data Meta_c may be composed of 5 data bits. In example embodiments disclosed in FIG. 8, the swizzling read signal SW_RD is applied through the first and second swizzling pins P_SW1 and P_SW2 as a signal of logic "1" and is applied through the third to eighth swizzling pins P_SW3 to P_SW8 as a signal of logic "0". Accordingly, a ninth data bit b4 and a tenth data bit b5 of the end page Page_End and a third data bit a3, a fourth data bit a4, a fifth data bit a5, a sixth data bit b1, a seventh data bit b2, and an eighth data bit b3 of the front page Page_Front may be output selectively and continuously through the swizzling circuit 128 (refer to FIG. 8). The data buffer 129 (refer to FIG. 2) may store sequential data bits continuously output from the swizzling circuit 128 and may output the sequential data bits to the controller 110 through a data signal DQ.

A read buffer included in the controller 110 may receive and store the sequential data bits through the data signal DQ. In the operation disclosed in FIG. 8, the sequential data bits stored in the read buffer may be re-ordered to extract the second meta data Meta_b. The controller 110 may extract the second meta data Meta_b by sequentially re-ordering data bits of the second meta data Meta_b, which are included in the sequential data bits.

Figure 9:
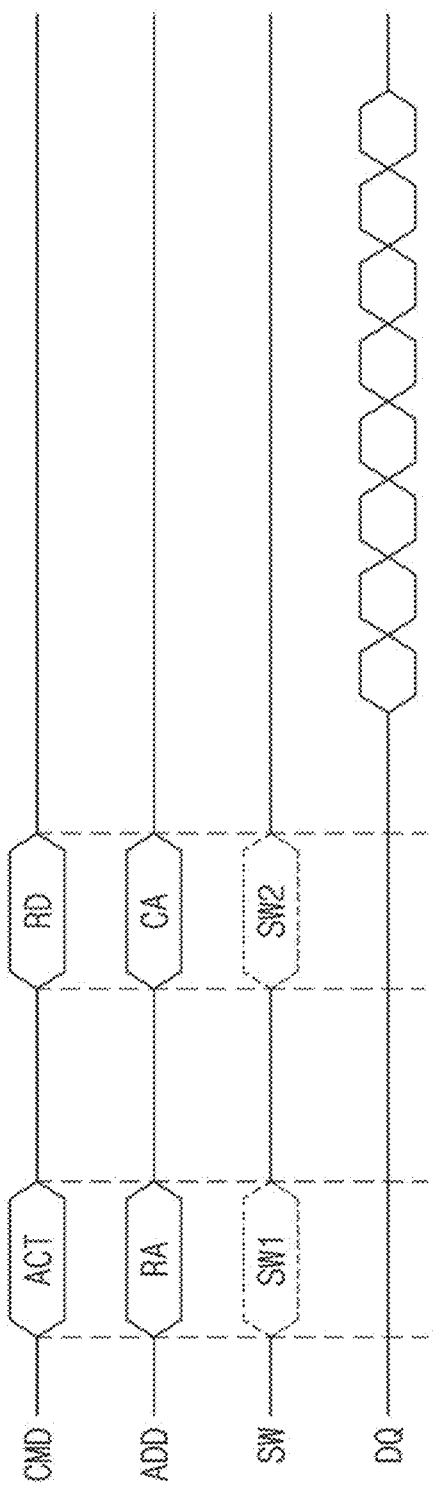
FIG. 9 is a timing diagram of signals used in performing a swizzling read operation according to example embodiments of the present disclosure.

FIG. 9 is a timing diagram of signals used in performing a swizzling read operation according to example embodiments of the present disclosure. In performing the swizzling read operation, the command signal CMD, the address signal ADD, and the swizzling signal SW disclosed in FIG. 9 may be transferred from the controller 110 (refer to FIG. 1) to the memory 120 (refer to FIG. 1), and the data signal DQ disclosed in FIG. 9 may be transferred from the memory 120 to the controller 110. Although not illustrated in FIG. 9, the memory device 100 (refer to FIG. 1) according to the present disclosure may use a clock signal, a row address strobe signal, a column address strobe signal, a data strobe signal, a chip enable signal, a read enable signal, a write enable signal, and/or the like to drive the memory 120. The command signal CMD, the address signal ADD, the swizzling signal SW, and the data signal DQ may be synchronized with the clock signal, the row address strobe signal, the column address strobe signal, and the data strobe signal.

The command signal CMD may include an active signal ACT and a read signal RD. The address signal ADD may include the row address signal RA and the column address signal CA. When the active signal ACT is enabled, the row address signal RA may be enabled in response to the active signal ACT. The memory device 100 may select a word line of a memory cell array, from which data are to be read, based on the row address signal RA. After the word line is selected, the read signal RD may be enabled. The column address signal CA may be enabled in response to the read signal RD. A bit line of a memory cell array, through which data are to be read, may be selected based on the column address signal CA.

In example embodiments of the present disclosure, the swizzling signal SW may be generated in the form of at least one of a first swizzling read signal SW1 enabled in response to the active signal ACT and a second swizzling read signal SW2 enabled in response to the read signal RD. The memory device 100 may select data bits to be read, based on the first swizzling read signal SW1 or the second swizzling read signal SW2. For example, the first swizzling read signal SW1 or the second swizzling read signal SW2 may be used to determine whether to read data stored in the front page Page_Front (refer to FIG. 6) or whether to read data stored in the end page Page_End (refer to FIG. 6).

When data bit to be read are selected based on the command signal CMD, the address signal ADD, and the swizzling read signal SW_RD, the memory 120 may generate the data signal DQ to output the data bits to the controller 110. The data signal DQ is disclosed in FIG. 9 as including 8 data bits, but this is only one example embodiment, not limiting the present disclosure.

Figure 10:
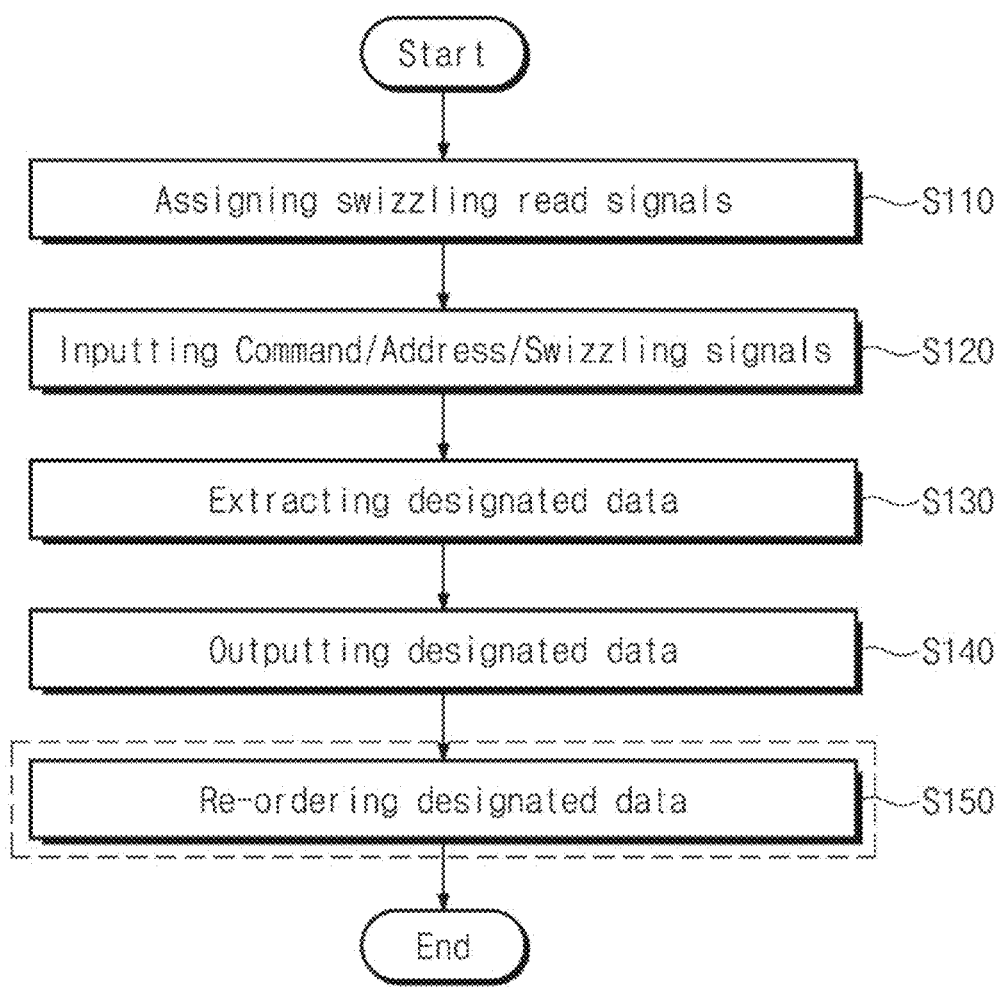
FIG. 10 is a flowchart for describing a swizzling read operation method according to example embodiments of the present disclosure.

FIG. 10 is a flowchart for describing a swizzling read operation method according to example embodiments of the present disclosure. In operation S110, the controller 110 (refer to FIG. 1) may assign the swizzling signal SW (refer to FIG. 9) for selecting and reading designated data bits. In example embodiments where the swizzling signal SW is assigned as a signal of logic "0" or logic "1", for example, a signal of logic "0" may be assigned to select a data bit included in the front page Page_Front (refer to FIG. 6), and a signal of logic "1" may be assigned to select a data bit included in the end page Page_End (refer to FIG. 6).

In operation S120, the controller 110 may transfer the command signal CMD (refer to FIG. 9), the address signal ADD (refer to FIG. 9), and the swizzling signal SW assigned in operation S110 to the memory 120 (refer to FIG. 1). The command signal CMD may include the active signal ACT (refer to FIG. 9) and the read signal RD, and the address signal ADD may include the row address signal RA (refer to FIG. 9) and the column address signal CA (refer to FIG. 9). The row decoder 123 (refer to FIG. 2) included in the memory 120 may receive the row address signal RA and may select a row corresponding to the row address signal RA from among rows of the memory cell array 127 (refer to FIG. 2). The output gating circuit 124 (refer to FIG. 2) included in the memory 120 may receive the column address signal CA and may select a column corresponding to the column address signal CA from among columns of the memory cell array 127. In example embodiments where the swizzling circuit 128 (refer to FIG. 2) is included in the memory 120, the swizzling signal SW may be input to the swizzling circuit 128; in example embodiments where the swizzling read circuit 128a (refer to FIG. 3) is included in the memory 120, the swizzling signal SW may be input to the swizzling read circuit 128a.

In operation S130, based on the swizzling signal SW, the memory 120 may select designated data, that is, may extract the designated data. The swizzling read operation may be implemented with respect to data bits placed within a burst length from a data bit stored in a memory cell that is designated by the row and the column selected in operation S120. For example, based on the swizzling signal SW, the memory 120 may select one of a first data bit included in a first page and a second data bit included in a second page.

In operation S140, the memory 120 may output data bits that are selectively extracted. Data bits that are selected by the swizzling circuit 128 (refer to FIG. 2) or the swizzling read circuit 128a (refer to FIG. 3) may be transferred to the serializer 130 (refer to FIG. 2) through the data buffer 129 (refer to FIG. 2). The serializer 130 may serialize the selected data bits. The serialized data bits may be output to the outside of the memory 120 through the driver 131 (refer to FIG. 2).

In operation S150, the controller 110 (refer to FIG. 1) may re-order designated data. For example, in example embodiments where first to eighth data bits are output to the outside of the memory 120 and data bits that the controller 110 requires are the remaining data bits of the first to eighth data bits other than the third to fifth data bits, the controller 110 may extract only the first and second data bits and the sixth to eighth data bits. Alternatively, the controller 110 may rearrange (or realign the arrangement of) the data bits output from the memory 120. When the swizzling read operation is performed in the memory device 100 according to example embodiments of the present disclosure, operation S150 will be omitted if necessary.

Figure 11:
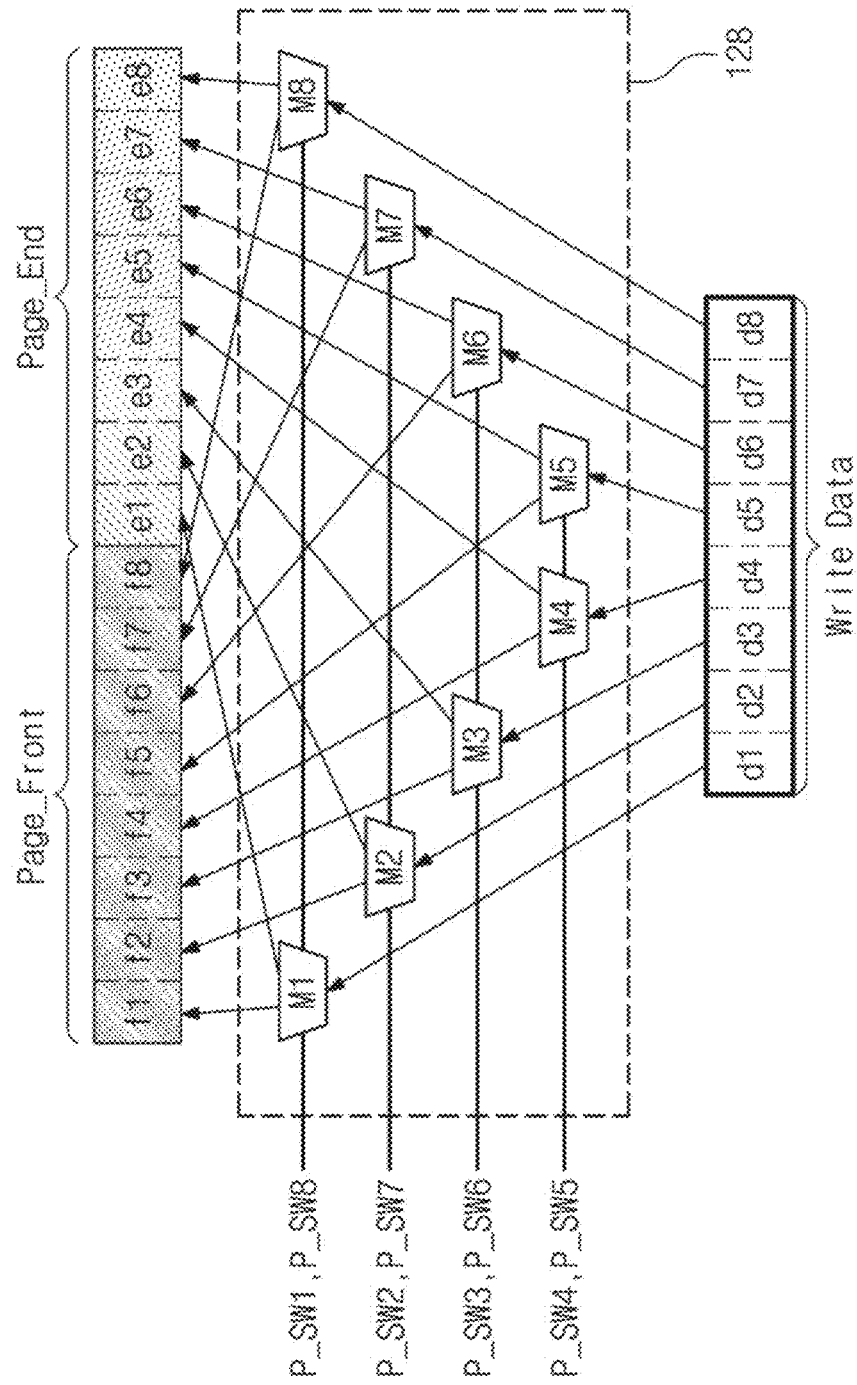
FIG. 11 is a diagram for describing a swizzling write operation according to example embodiments of the present disclosure.

FIG. 11 is a diagram for describing a swizzling write operation according to example embodiments of the present disclosure. The description will be given with reference to FIG. 11 under the assumption that a burst length of the memory device 100 (refer to FIG. 1) corresponds to 8 data bits and one page is formed of a space capable of storing 16 data bits. For convenience of description, one page disclosed in FIG. 11 is expressed as composed of the front page Page_Front and the end page Page_End, and each of the front page Page_Front and the end page Page_End is expressed as including a space capable of storing 8 data bits, the number of which corresponds to the burst length. However, example embodiments disclosed in FIG. 11 are only example embodiments of the present disclosure, not limiting the present disclosure.

As described with reference to FIG. 6, the memory device 100 according to the present disclosure, which includes the swizzling circuit 128, may reduce or prevent the above overhead in the write operation. The swizzling circuit 128 may include demultiplexers DEMUX, the number of which corresponds to a burst length. A demultiplexer may be implemented by using a multiplexer. For example, signal input terminals of a multiplexer may be used as signal output terminals of a demultiplexer, and a signal output terminal of the multiplexer may be used as a signal input terminal of the demultiplexer. The first to eighth multiplexers M1 to M8 disclosed in FIG. 11 may operate as a demultiplexer in the swizzling write operation.

The multiplexers M1 to M8 may respectively select locations of the memory device 100, at which data bits d1 to d8 are to be written. The locations at which the data bits d1 to d8 are to be written may be determined by the swizzling signal SW (refer to FIG. 2) that is applied to each of the first to eighth swizzling pins P_SW1 to P_SW8. The first to eighth swizzling pins P_SW1 to P_SW8 may be implemented with pins classified as RFU pins in the memory 120 (refer to FIG. 1).

For example, in example embodiments where the swizzling signal SW of a first logical level (e.g., logic "0") is applied, the memory device 100 according to example embodiments of the present disclosure may write a data bit to a space included in the front page Page_Front; in example embodiments where the swizzling signal SW of a second logical level (e.g., logic "1") is applied, the memory device 100 according to example embodiments of the present disclosure may write a data bit to a space included in the end page Page_End. Accordingly, in example embodiments where a signal of the first logical level is applied to the first swizzling pin P_SW1, the memory device 100 may write the first data bit d1 to a first space f1 included in the front page Page_Front from among the first space f1 included in the front page Page_Front and a ninth space e1 included in the end page Page_End. In example embodiments where a signal of the second logical level is applied to the second swizzling pin P_SW2, the memory device 100 may write the second data bit d2 to a tenth space e2 included in the end page Page_End from among a second space f2 included in the front page Page_Front and the tenth space e2 included in the end page Page_End.

Figure 12:
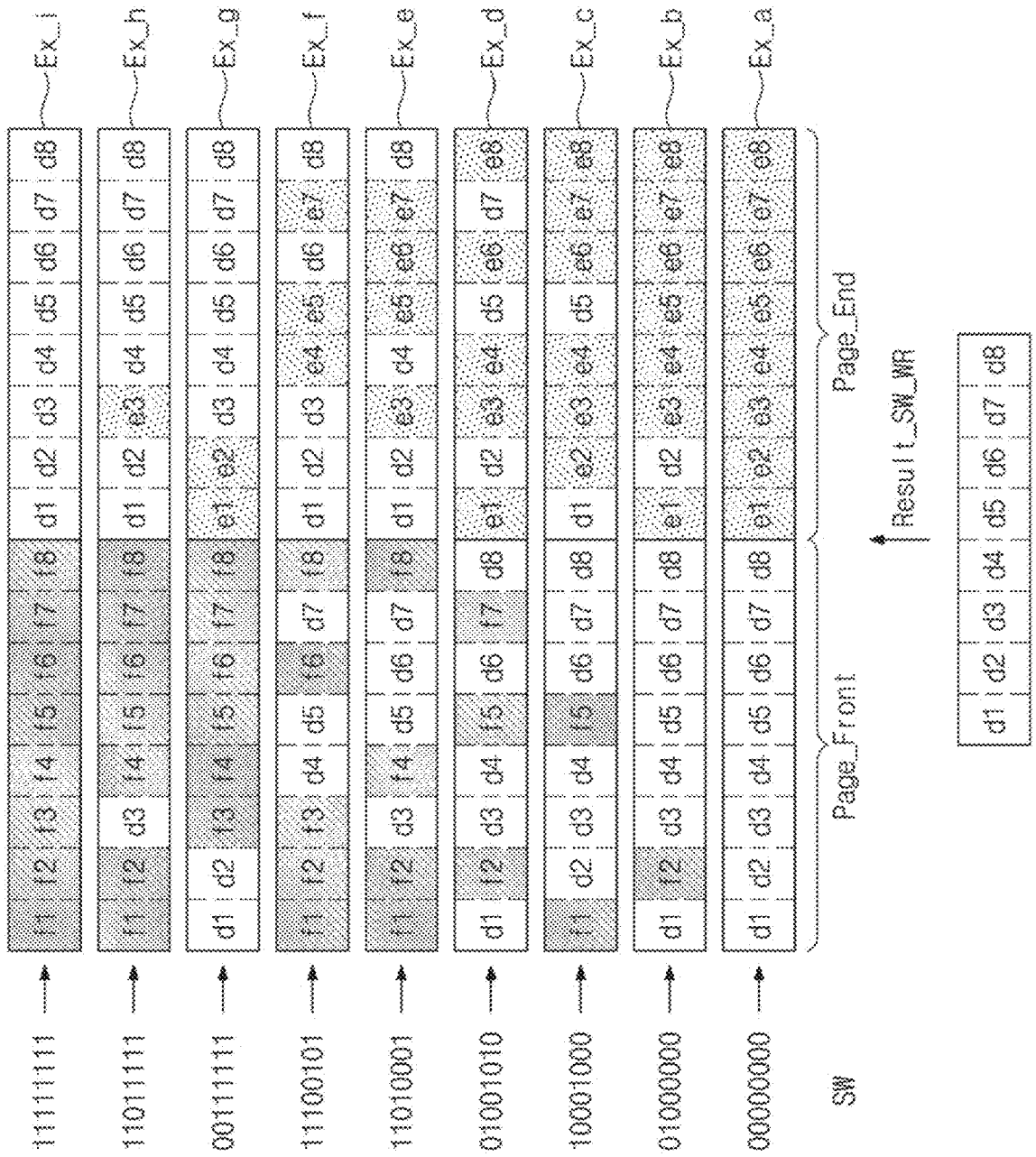
FIG. 12 is a diagram illustrating an example of results of swizzling write operations according to example embodiments of the present disclosure.

FIG. 12 is a diagram illustrating an example of results Result_SW_WR of swizzling write operations according to example embodiments of the present disclosure. The results Result_SW_WR of the swizzling write operations of FIG. 12 may be obtained under the assumption that the memory device 100 (refer to FIG. 1) according to example embodiments of the present disclosure is designed to write a data bit to a space included in the front page Page_Front when the swizzling signal SW (refer to FIG. 2) of logic "0" is applied and to write a data bit to a space included in the end page Page_End when the swizzling signal SW of logic "1" is applied. The results Result_SW_WR of the swizzling read operations disclosed in FIG. 12 relate to only some example embodiments according to the present disclosure, and the memory device 100 (refer to FIG. 1) according to the present disclosure may draw various results depending on how to design the memory device 100.

As a result of writing the data bits d1 to d8 to the first to eighth spaces f1 to f8 included in the front page Page_Front, a first result Ex_a disclosed in FIG. 12 indicates a result that is obtained when "00000000" are respectively applied to the first to eighth swizzling pins P_SW1 to P_SW8 (refer to FIG. 11). A second result Ex_b disclosed in FIG. 12 indicates a result that is obtained when "01000000" are applied, a third result Ex_c indicates a result that is obtained when "10001000" are applied, a fourth result Ex_d indicates a result that is obtained when "01001010" are applied, and a fifth result Ex_e indicates a result that is obtained when "11010001" are applied. A sixth result Ex_f indicates a result that is obtained when "11100101" are applied, a seventh result Ex_g indicates a result that is obtained when "00111111" are applied, an eighth result Ex_h indicates a result that is obtained when "11011111" are applied, and a ninth result Ex_i indicates a result that is obtained when "11111111" are applied.

Figure 13:
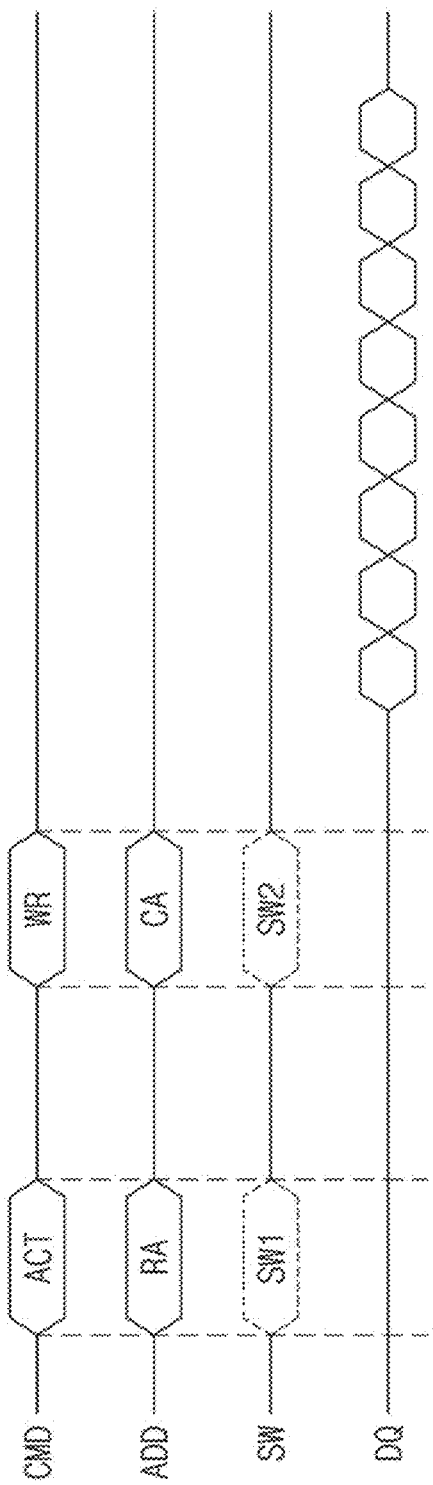
FIG. 13 is a timing diagram of signals used in performing a swizzling write operation according to example embodiments of the present disclosure.

FIG. 13 is a timing diagram of signals used in performing a swizzling write operation according to example embodiments of the present disclosure. When the swizzling write operation is performed, the command signal CMD, the address signal ADD, the swizzling signal SW, and the data signal DQ disclosed in FIG. 13 may be transferred from the controller 110 (refer to FIG. 1) to the memory 120 (refer to FIG. 1). Although not illustrated in FIG. 13, the memory device 100 (refer to FIG. 1) according to the present disclosure may use a clock signal, a row address strobe signal, a column address strobe signal, a data strobe signal, and/or the like to drive the memory 120. The command signal CMD, the address signal ADD, the swizzling signal SW, and the data signal DQ may be synchronized with the clock signal, the row address strobe signal, the column address strobe signal, and the data strobe signal.

The command signal CMD may include the active signal ACT and a write signal WR. The address signal ADD may include the row address signal RA and the column address signal CA. When the active signal ACT is enabled, the row address signal RA may be enabled in response to the active signal ACT. The memory device 100 may select a word line of a memory cell array, at which data are to be written, based on the row address signal RA. After the word line is selected, the write signal WR may be enabled. The column address signal CA may be enabled in response to the write signal WR. A bit line of a memory cell array, through which data are to be written, may be selected based on the column address signal CA.

In example embodiments of the present disclosure, the swizzling signal SW may be generated in the form of at least one of a first swizzling signal SW1 enabled in response to the active signal ACT and a second swizzling signal SW2 enabled in response to the write signal WR. The memory device 100 may select a storage space, in which data bits are to be written, based on the first swizzling signal SW1 or the second swizzling signal SW2. For example, the first swizzling signal SW1 or the second swizzling signal SW2 may be used to determine whether to store each data bit in the front page Page_Front (refer to FIG. 11) or whether to store each data bit in the end page Page_End (refer to FIG. 11).

When storage spaces where data bits are to be written are selected based on the command signal CMD, the address signal ADD, and the swizzling signal SW, the controller 110 may generate the data signal DQ to input the data bits to the memory 120. The data signal DQ is disclosed in FIG. 13 as including 8 data bits, but this is only one example embodiment, not limiting the present disclosure.

Figure 14:
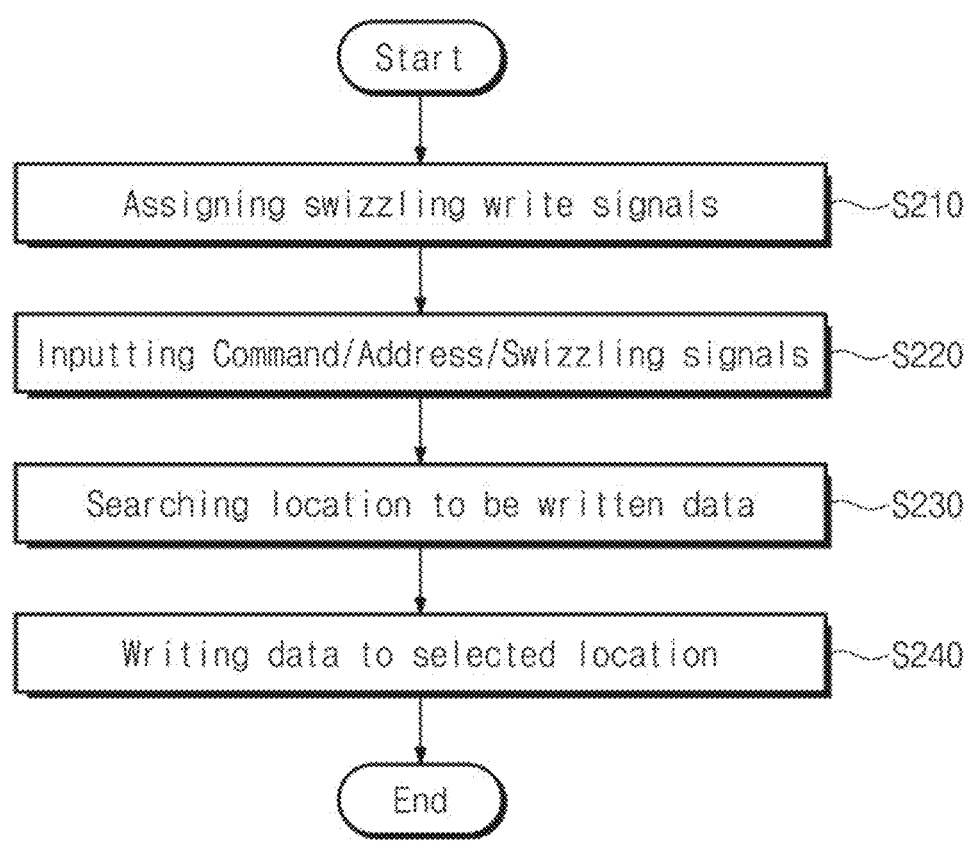
FIG. 14 is a flowchart for describing a swizzling write operation method according to example embodiments of the present disclosure.

FIG. 14 is a flowchart for describing a swizzling write operation method according to example embodiments of the present disclosure. In operation S210, the controller 110 (refer to FIG. 1) may assign the swizzling signal SW (refer to FIG. 13) for selecting a designated space in which data bits are to be written. In example embodiments where the swizzling signal SW is assigned as a signal of logic "0" or logic "1", for example, a signal of logic "0" may be assigned to select a space of the front page Page_Front (refer to FIG. 11), in which a data bit is to be written, and a signal of logic "1" may be assigned to select a space of the end page Page_End (refer to FIG. 11), in which a data bit is to be written. Alternatively, a signal of logic "1" may be assigned to select a space of the front page Page_Front (refer to FIG.

11), in which a data bit is to be written, and a signal of logic "0" may be assigned to select a space of the end page Page_End (refer to FIG. 11), in which a data bit is to be written.

In operation S220, the controller 110 may transfer the command signal CMD (refer to FIG. 13), the address signal ADD (refer to FIG. 13), and the swizzling signal SW assigned in operation S210 to the memory 120 (refer to FIG. 1). The command signal CMD may include the active signal ACT (refer to FIG. 13) and the write signal WR, and the address signal ADD may include the row address signal RA (refer to FIG. 13) and the column address signal CA (refer to FIG. 13). In example embodiments where the swizzling circuit 128 (refer to FIG. 2) is included in the memory 120, the swizzling signal SW may be input to the swizzling circuit 128; in example embodiments where the swizzling write circuit 128b (refer to FIG. 3) is included in the memory 120, the swizzling signal SW may be input to the swizzling write circuit 128b.

In operation S230, based on the swizzling signal SW, the memory 120 may select and extract a designated space in which the designated data are to be written. The memory 120 may determine a region targeted for the swizzling write operation, based on the address signal ADD input in operation S120. The memory 120 may select a space, in which data bits are to be written, from the region targeted for the swizzling write operation, based on the swizzling signal SW.

In operation S240, the memory 120 may write data bits to the space selected in operation S230. For example, when a first space included in a first page is selected by the swizzling signal SW, the memory 120 may write a first data bit in the first space included in the first page. Alternatively, when a second space included in a second page is selected by the swizzling signal SW, the memory 120 may write a second data bit in the second space included in the second page.

Figure 15:
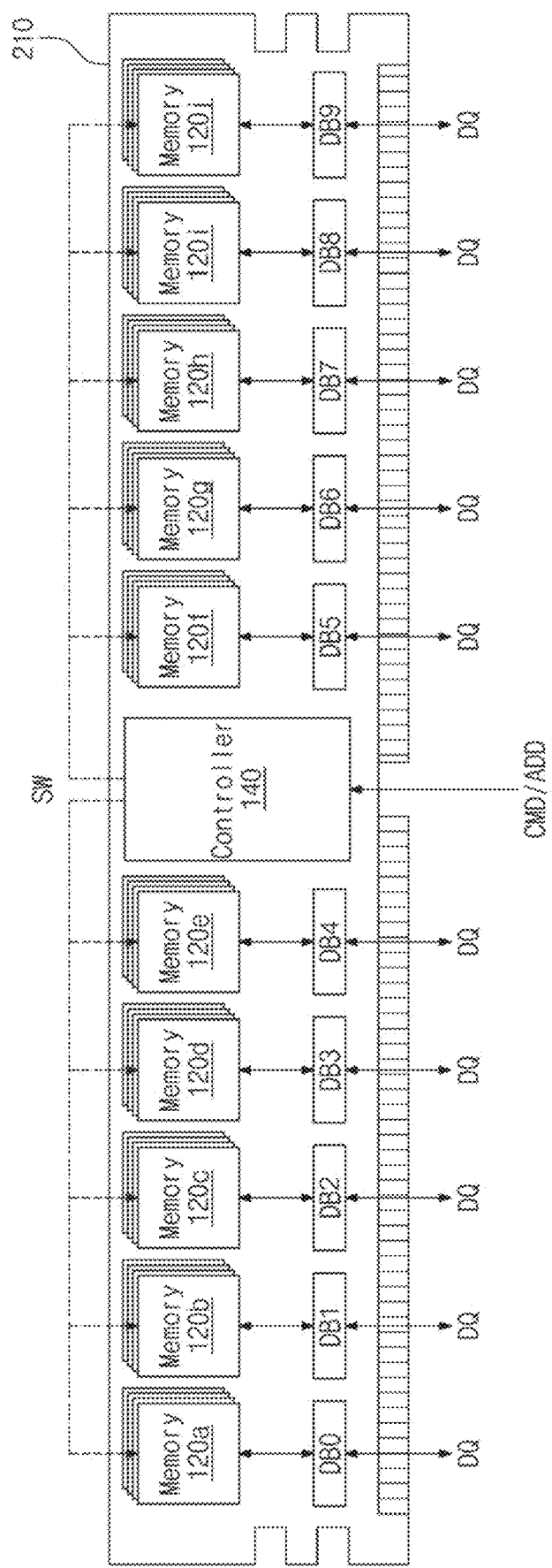
FIG. 15 is a diagram illustrating a memory module supporting a swizzling operation, according to example embodiments of the present disclosure.

FIG. 15 is a diagram illustrating a memory module 210 supporting a swizzling operation, according to example embodiments of the present disclosure. Referring to FIG. 15, the memory module 210 may include a controller 140, first to tenth memories 120a to 120j, and first to tenth data buffers DB0 to DB9. The first to tenth memories 120a to 120j may be implemented with one of various memories such as a DRAM and a PRAM. Each of the first to tenth memories 120a to 120j may correspond to the memory 120 described with reference to FIGS. 1 to 14.

The first to tenth memories 120a to 120j may correspond to the first to tenth data buffers DB0 to DB9, respectively. In example embodiments of implementing the memory module 210 that supports the swizzling operation according to the present disclosure, the number of memories included in the memory module 210 and the number of data buffers included in the memory module 210 are not limited to example embodiments illustrated in FIG. 15. Also, the memory module 210 may further include any other components, as well as the components illustrated in FIG. 15.

The controller 140 may correspond to the controller 110 described with reference to FIGS. 1 to 14. Alternatively, the controller 140 may include a register clock driver (RCD) that is controlled by an external controller, that is, the controller 110 described with reference to FIGS. 1 to 14. The RCD may control the memory module 210 depending on a command of the controller 110. The controller 140 may receive the command signal CMD and the address signal ADD from an external host device. The controller 140 may buffer the command signal CMD and the address signal ADD received from the external host device. Also, the controller 140 may transfer the buffered command signal CMD and the buffered address signal ADD to the first to tenth memories 120a to 120j. Also, the controller 140 may transfer the swizzling signal SW for the swizzling operation of the memory module 210 to the first to tenth memories 120a to 120j.

Each of the first to tenth memories 120a to 120j may perform the swizzling operation based on the swizzling signal SW from the controller 140. In example embodiments where the swizzling read operation is performed, data bits extracted from the first to tenth memories 120a to 120j may be transferred to the first to tenth data buffers DB0 to DB9 respectively corresponding to the first to tenth memories 120a to 120j, so as to be output to the outside through the data signal DQ. In example embodiments where the swizzling write operation is performed, the data signal DQ may be received through each of the first to tenth data buffers DB0 to DB9 from the outside. The data signals DQ input to the first to tenth data buffers DB0 to DB9 may be respectively transferred to the first to tenth memories 120a to 120j corresponding to the first to tenth data buffers DB0 to DB9. Data bits included in the data signals DQ may be written to selected spaces of the first to tenth memories 120a to 120j.

Figure 16A:
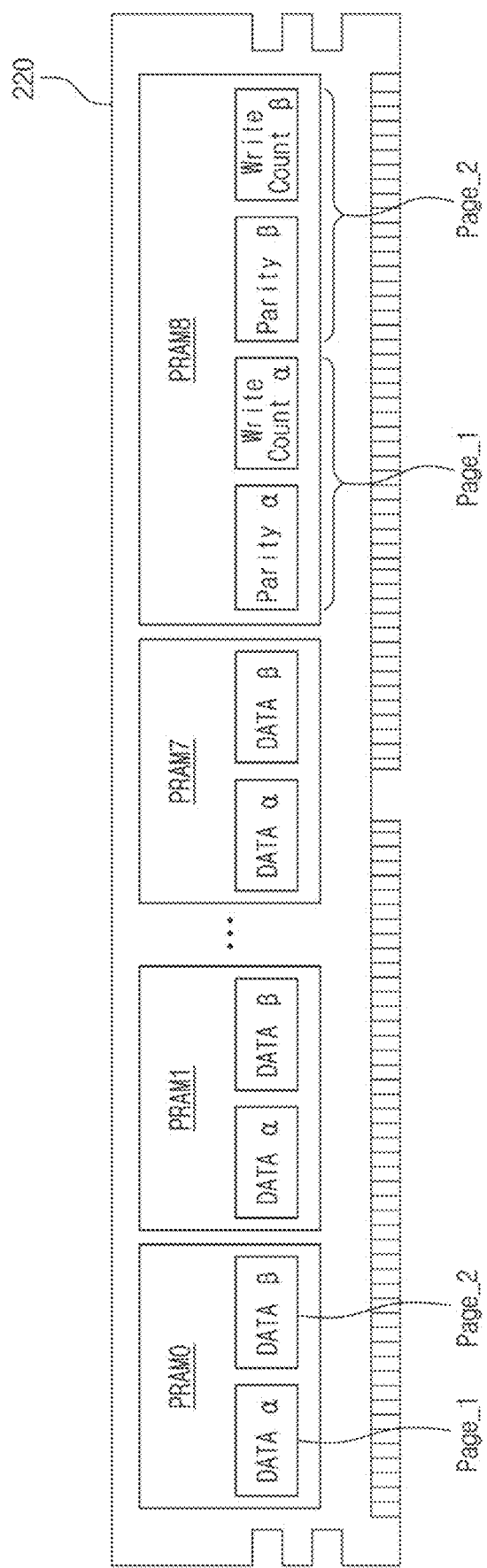
FIG. 16A is a diagram illustrating a memory module supporting a swizzling operation, according to other example embodiments of the present disclosure.

FIG. 16A is a diagram illustrating a PRAM memory module 220 supporting a swizzling operation, according to other example embodiments of the present disclosure. Referring to FIG. 16A, the PRAM memory module 220 may include first to ninth memory cell arrays PRAM0 to PRAM8. Each of the first to eighth memory cell arrays PRAM0 to PRAM7 may include a first page Page_1 in which a first data bit DATA α is capable of being stored and a second page Page_2 in which a second data bit DATA β is capable of being stored. The ninth memory cell array PRAM8 may include a first page Page_1 in which a first parity bit Parity α and a first write count bit Write Count α are capable of being stored and a second page Page_2 in which a second parity bit Parity β and a second write count bit Write Count β are capable of being stored.

Although not illustrated in FIG. 16A, as in the DRAM memory module 210 disclosed in FIG. 15, the PRAM memory module 220 disclosed in FIG. 16A may receive the command signal CMD, the address signal ADD, and the swizzling signal SW from the outside. The same principle described above in the specification may be applied to a manner in which the PRAM memory module 220 according to example embodiments of the present disclosure performs the swizzling operation.

Figure 16B:
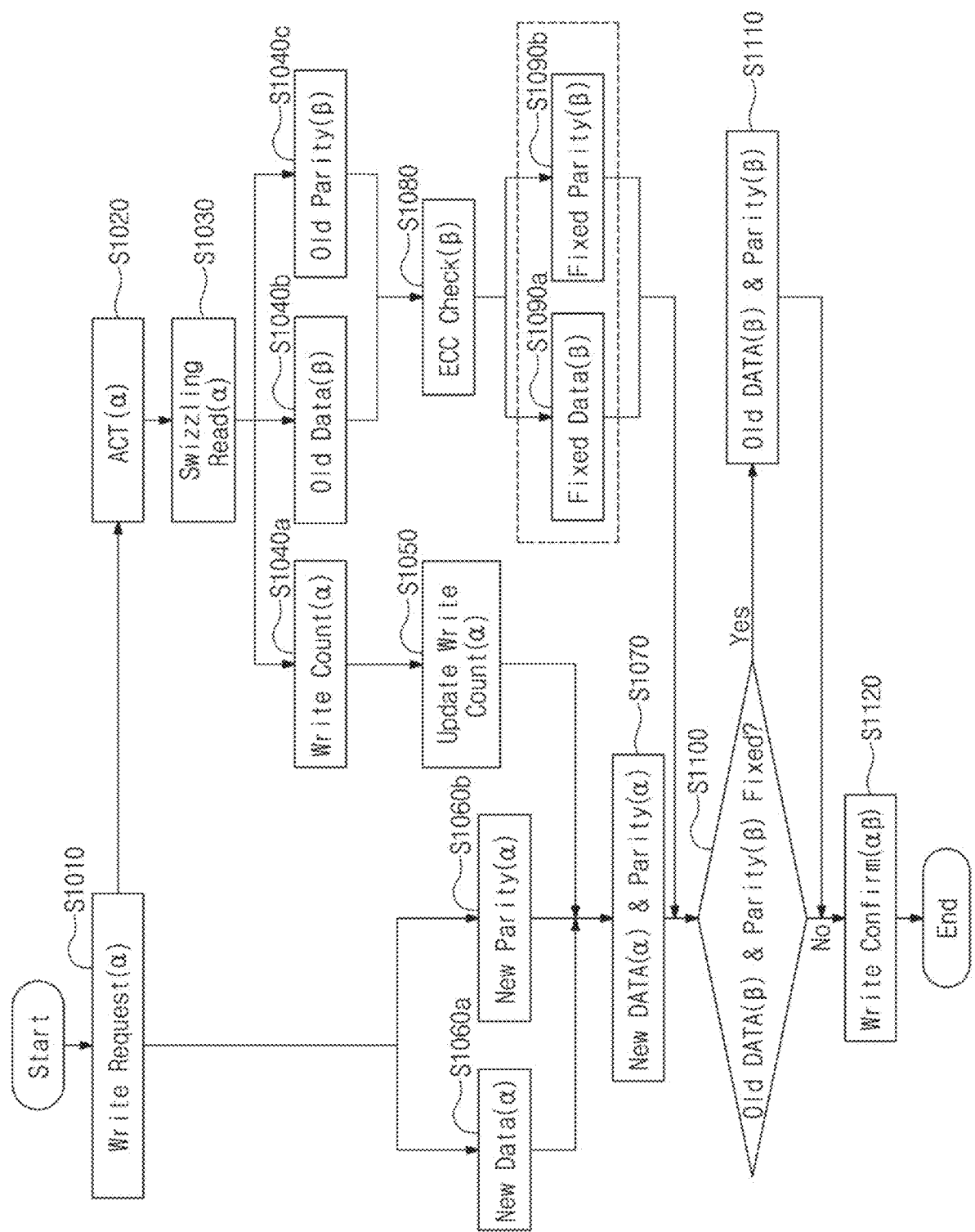
FIG. 16B is a flowchart illustrating a method for performing wear-leveling based on a swizzling operation according to the present disclosure, in a PRAM memory module disclosed in FIG. 16A.

FIG. 16B is a flowchart illustrating a method for additionally performing a defensive code based on a swizzling operation according to the present disclosure while a read operation of the PRAM memory module 220 is performed to update a write count necessary for wear-leveling in the PRAM memory module 220 (refer to FIG. 16A) disclosed in FIG. 16A. The wear-leveling is performed to reduce or prevent a specific block from being excessively used. To this end, the number of times of usage of each block may be counted, and new data may be preferentially written to a block having the smallest number of times of usage.

When the command signal CMD (refer to FIG. 1) for performing the write operation is received, the memory device 100 (refer to FIG. 1) that performs the wear-leveling may first read a write count bit Write Count α or Write Count β stored in the PRAM memory module 220. In example embodiments where the swizzling operation according to the present disclosure is not performed, in the PRAM memory module 220, the first write count bit Write Count α may be read through the following: 1) read both the first data bit DATA α of the first page Page_1 in each of the first to eighth PRAM memory cell arrays PRAM0 to PRAM7 and the first parity bit Parity α and the first write count bit Write Count α included in the ninth PRAM memory cell array PRAM8, and 2) extract the first write count bit Write Count α from the first data bits DATA α, the first parity bit Parity α, and the first write count bit Write Count α. The write count bit Write Count α or Write Count β may be used for the wear-leveling. The first data bit DATA α and the first parity bit Parity α correspond to data unnecessary to perform the wear-leveling. In other words, in example embodiments where the swizzling operation is not performed, the overhead that unnecessary data are read occurs.

In contrast, in the PRAM memory module 220, the occurrence of the overhead described above may be reduced or prevented by performing the swizzling operation according to the present disclosure. Referring to FIG. 16B, in operation S1010, the memory device 100 according to the present disclosure may request a command for writing the first data bit Data α to the first page Page_1 included in each of the first to eighth PRAM memory cell arrays PRAM0 to PRAM7.

In operation S1020, the active signal ACT (refer to FIG. 9 or 13) that is based on the command may be generated. Because it is necessary to read the first write count bit Write Count α for the purpose of performing the wear-leveling operation, the active signal ACT may be a signal that is based on a read command.

In operation S1030, to reduce or prevent the occurrence of the overhead, the PRAM memory module 220 may perform the swizzling read operation. Through the swizzling read operation, the PRAM memory module 220 may selectively read the first write count bit Write Count α necessary for the wear-leveling and simultaneously, may selectively read data bits necessary to perform any other operation. For example, the other operation may include an error detection and correction operation. The memory device 100 may use an error correction code (ECC) for the purpose of detecting and correcting an error.

Through the swizzling read operation, the memory device 100 may read the first write count bit Write Count α in operation S1040a, may read the second data bit Data β of the second page Page_2 in each of the first to eighth PRAM memory cell arrays PRAM0 to PRAM7 in operation S1040b, and may read the second parity bit Parity β included in the ninth PRAM memory cell array PRAM8 in operation S1040c. Operation S1040a to operation S1040c may be performed in parallel, and operation S1040b and operation S1040c may correspond to a procedure for the error detection and correction operation.

In operation S1050, to write the first data bit Data α and the first parity bit Parity α, the memory device 100 may update the first write count bit Write Count α. In operation S1060a, the memory device 100 may generate the data signal DQ (refer to FIG. 1) associated with a first new data bit Data α to be written to the first page Page_1 of each of the first to eighth PRAM memory cell arrays PRAM0 to PRAM7. In operation S1060b, the memory device 100 may generate the data signal DQ associated with a first new parity bit Parity α to be written to the first page Page_1 of the ninth PRAM memory cell array PRAM8. Operation S1050, operation S1060a, and operation S1060b may be sequentially performed. However, the present disclosure is not limited thereto. For example, operation S1050, operation S1060a, and operation S1060b may be performed simultaneously (or in parallel).

In operation S1070, the memory device 100 may write the first write count bit Write Count α updated in operation S1050, and the first new data bits Data α and the first new parity bit Parity α generated in operation S1060a and operation S1060b so as to be included in the data signal DQ, to the first to ninth PRAM memory cell arrays PRAM0 to PRAM8 included in the PRAM memory module 220. After operation S1070 is performed, the procedure proceeds to S1100.

In operation S1080, the memory device 100 may perform the error detection and correction operation on the second data bit Data β read in operation S1040b and the second parity bit Parity β read in operation S1040c. When it is determined that an error occurs at the second data bit Data β, in operation S1090a, the memory device 100 may correct the error detected from the second data bit Data β. When it is determined that an error occurs at the second parity bit Parity β, in operation S1090b, the memory device 100 may correct the error detected from the second parity bit Parity β.

Operation S1090a and operation S1090b may be performed in parallel. In some example embodiments, when it is determined that an error occurs only at the second data bit Data β, operation S1090a may be performed, while operation S1090b may be performed; when it is determined that an error occurs only at the second parity bit Parity β, operation S1090b may be performed, while operation S1090a may be performed. When it is determined that an error does not occur at both the second data bit Data β and the second parity bit Parity β, both operation S1090a and operation S1090b may be omitted. After operation S1090a and operation S1090b are performed, the procedure proceeds to S1100.

In operation S1100, the memory device 100 may determine whether errors included in the second data bit Data β and the second parity bit Parity β are corrected. When it is determined that the errors included in the second data bit Data β and the second parity bit Parity β are corrected, the procedure proceeds to operation S1110. When it is determined that the errors included in the second data bit Data β and the second parity bit Parity β are not corrected, the procedure proceeds to operation S1120.

In operation S1110, the memory device 100 may write second new data bits Data β error-corrected and a second parity bit Parity β error-corrected, to the first to ninth PRAM memory cell arrays PRAM0 to PRAM8. After operation S1110 is performed, the procedure proceeds to S1120. In operation S1120, the memory device 100 may confirm whether the write operation associated with the first to ninth PRAM memory cell arrays PRAM0 to PRAM8 is completed and may terminate the procedure.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

According to the present disclosure, the overhead occurring while data are processed at a memory device operating in a burst mode may be reduced by supporting a data swizzling operation, and thus, the performance of a semiconductor device may be improved.

While the present disclosure has been described with reference to some example embodiments thereof, it will be apparent to those of ordinary skill in the art that various changes and modifications may be made thereto without departing from the spirit and scope of the present disclosure as set forth in the following claims.

What is claimed is:

1. A method of performing, at a controller, an access to a memory device, the method comprising:
   transmitting, at the controller, a first command signal, a first address signal, and a first swizzling signal to the memory device, the first swizzling signal including a number of bits equal to a burst length;
   determining first data bits stored in a memory cell array of the memory device based on the first command signal and the first address signal, the first data bits including front bits and end bits;
   determining read bits by choosing between each bit of the front bits and a respective corresponding bit of the end bits in a bitwise manner according to the first swizzling signal; and
   sequentially outputting, at the memory device, the read bits in a burst manner.

2. The method of claim 1, further comprising:
   rearranging the read bits.

3. The method of claim 1, further comprising:
   transmitting, at the controller, a second command signal, a second address signal, and a second swizzling signal to the memory device; and
   writing, at the memory device, second data bits to memory cells, which are selected based on the second swizzling signal, from among memory cells corresponding to the second address signal.

4. The method of claim 3, further comprising:
   receiving, at the controller, a third address signal from an external host device to output the first address signal and the first swizzling signal, or the second address signal and the second swizzling signal.

5. The method of claim 3, further comprising:
   receiving, at the controller, the first swizzling signal and the second swizzling signal from an external host device.

6. The method of claim 3, further comprising:
   transmitting, at the controller, a read request to the memory device in response to that a write request for the second data bits is generated,
   wherein the sequentially outputting the read bits in the burst manner includes outputting a write count of the second data bits, the first data bits, and parity bits of the first data bits, and
   wherein the method further comprises:
   performing, at the controller, an error detection and correction operation on the first data bits, based on the first data bits and the parity bits of the first data bits.

7. The method of claim 6, further comprising:
   in response to that at least one data bit of the first data bits is corrected through the error detection and correction operation, writing the at least one corrected data bit to the memory device.

8. A memory device comprising:
   a memory cell array including a plurality of memory cells; and
   a peripheral circuit configured to:
   receive a first command signal, a first address signal, and a first swizzling signal, the first swizzling signal including a number of bit equal to a burst length;
   read first data bits stored in the plurality of memory cells based on the first command signal and the first address signal, the first data bits including front bits and end bits;
   determine read bits by choosing between each bit of the front bits and a respective corresponding bit of the end bits in a bitwise manner according to the first swizzling signal; and
   sequentially output the read bits.

9. The memory device of claim 8, wherein
   the peripheral circuit is configured to
   receive a second command signal, a second address signal, a second swizzling signal, and second data bits; and
   write the second data bits to a part, which is selected by the second swizzling signal, from among memory cells corresponding to the second address signal.

10. The memory device of claim 9, wherein the peripheral circuit includes a plurality of multiplexers/demultiplexers, a number of which corresponds to the burst length,
    wherein the plurality of multiplexers/demultiplexers operate as a multiplexer in a read operation, and
    wherein the plurality of multiplexers/demultiplexers operates as a demultiplexer in a write operation.

11. The memory device of claim 10, wherein the peripheral circuit includes:
    a swizzling read circuit configured to determine the read bits based on the first swizzling signal; and
    a swizzling write circuit configured to select the part of the memory cells corresponding to the second address signal, based on the second swizzling signal.

12. The memory device of claim 9, wherein the peripheral circuit includes a plurality of multiplexers configured to determine the read bits, based on the first swizzling signal, and
    wherein a number of the plurality of multiplexers corresponds to the burst length.

13. The memory device of claim 9, wherein the peripheral circuit includes a plurality of demultiplexers configured to select the part of the memory cells, based on the second swizzling signal, and
    wherein a number of the plurality of demultiplexers corresponds to the burst length.

14. The memory device of claim 8, wherein the memory cell array includes one of at least one DRAM memory cell array and at least one PRAM memory cell array.

15. A memory system comprising:
    a memory including a plurality of memory cell arrays; and
    a controller configured to exchange a data signal with the memory and to control an operation of the memory, the data signal including first data bits equal to a size of a burst length,
    wherein the memory is configured to:
    receive a first command signal, a first address signal, and a first swizzling signal from the controller, the first swizzling signal including a number of bits equal to the burst length;
    determine a space in the memory cells, based on the first address signal, the space being equal to twice the size of the burst length and the space including a front and an end;
    determine whether each bit, of first data bits, is to be written to the front or to the end based on the first swizzling signal; and
    write each bit of the first data bits to either the front or the end.

16. The memory system of claim 15, wherein the memory is configured to:
- receive a second command signal, a second address signal, and a second swizzling signal from the controller;
- select second data bits stored in the memory based on the second command signal and the second address signal; and
- sequentially output a part, which corresponds to the second swizzling signal, from among the second data bits in a burst manner.

17. The memory system of claim 15, wherein the memory further includes a plurality of multiplexers/demultiplexers, a number of which corresponds to the burst length,
- wherein the plurality of multiplexers/demultiplexers operate as a multiplexer in a read operation, and
- wherein the plurality of multiplexers/demultiplexers operates as a demultiplexer in a write operation.

18. The memory system of claim 16, wherein the memory further includes:
- a swizzling write circuit configured to determine whether each bit, of the first data bits, is to be written to the front or to the end based on the first swizzling signal; and
- a swizzling read circuit configured to select the part of the second data bits, based on the second swizzling signal.

19. The memory system of claim 16, wherein the memory further includes a plurality of demultiplexers configured to determine whether each bit, of the first data bits, is to be written to the front or to the end based on the first swizzling signal, and
- wherein a number of the plurality of demultiplexers corresponds to the burst length.

20. The memory system of claim 16, wherein the memory further includes a plurality of multiplexers configured to select the part of the second data bits, based on the second swizzling signal, and
- wherein a number of the plurality of multiplexers corresponds to the burst length.

* * * * *